US012777698B2

(12) United States Patent
Xie et al.

(10) Patent No.: US 12,777,698 B2
(45) Date of Patent: Oct. 27, 2026

(54) VIA FORMATION ADJACENT A MIDDLE-OF-LINE CONTACT

(71) Applicant: International Business Machines Corporation, Armonk, NY (US)

(72) Inventors: Ruilong Xie, Niskayuna, NY (US); Carl Radens, LaGrangeville, NY (US); Lawrence A. Clevenger, Saratoga Springs, NY (US); Huimei Zhou, Albany, NY (US); Tao Li, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 18/439,143

(22) Filed: Feb. 12, 2024

(65) Prior Publication Data

US 2025/0261422 A1 Aug. 14, 2025

(51) Int. Cl.

| | |
|---|---|
| ***H01L 29/66*** | (2006.01) |
| ***H01L 21/8234*** | (2006.01) |
| ***H01L 23/528*** | (2006.01) |
| ***H01L 27/088*** | (2006.01) |
| ***H01L 29/06*** | (2006.01) |
| ***H01L 29/08*** | (2006.01) |
| ***H01L 29/423*** | (2006.01) |
| ***H01L 29/775*** | (2006.01) |
| ***H01L 29/786*** | (2006.01) |
| ***H10B 10/00*** | (2023.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/13*** | (2025.01) |

(Continued)

(52) U.S. Cl.

CPC .......... *H10D 64/017* (2025.01); *H10B 10/12* (2023.02); *H10D 30/014* (2025.01); *H10D 30/43* (2025.01); *H10D 30/6735* (2025.01); *H10D 30/6757* (2025.01); *H10D 62/121* (2025.01); *H10D 62/151* (2025.01); *H10D 84/0149* (2025.01); *H10D 84/038* (2025.01); *H10D 84/83* (2025.01); *H10W 20/427* (2026.01)

(58) Field of Classification Search

CPC .... H10D 64/017; H10D 30/014; H10D 30/43; H10D 30/6735; H10D 30/6757; H10D 62/121; H10D 62/151; H10D 84/0149; H10D 84/038; H10D 84/83; H10B 10/12; H10W 20/427; H10W 20/069; H10W 20/0698; H10W 20/42; H10W 20/435

USPC .......................................................... 257/288

See application file for complete search history.

(56) References Cited

U.S. PATENT DOCUMENTS

| | | | |
|---|---|---|---|
| 9,570,395 | B1 | 2/2017 | Sengupta et al. |
| 10,586,765 | B2 | 3/2020 | Smith et al. |

(Continued)

*Primary Examiner* — Tong-Ho Kim

(74) *Attorney, Agent, or Firm* — Kimberly Zillig; Ryan, Mason & Lewis, LLP

(57) ABSTRACT

A semiconductor device comprises a contact electrically connected to a source/drain region of a transistor and to a gate region of the transistor. A via is disposed along a side of the contact, wherein the via comprises a conductive material. A dielectric liner layer is disposed around at least a portion of the conductive material. The dielectric liner layer electrically isolates the contact from the conductive material, and the via contacts a bit-line.

20 Claims, 26 Drawing Sheets

(51) Int. Cl.

| | |
|---|---|
| ***H10D 64/01*** | (2025.01) |
| ***H10D 84/01*** | (2025.01) |
| ***H10D 84/03*** | (2025.01) |
| ***H10D 84/83*** | (2025.01) |
| ***H10W 20/41*** | (2026.01) |

(56) References Cited

U.S. PATENT DOCUMENTS

| | | | | |
|---|---|---|---|---|
| 10,636,739 | B2 | 4/2020 | Beyne et al. | |
| 10,700,207 | B2 | 6/2020 | Chen et al. | |
| 11,004,856 | B1 | 5/2021 | Zhang et al. | |
| 11,328,750 | B1 | 5/2022 | Amirante et al. | |
| 2020/0105671 | A1 | 4/2020 | Lai et al. | |
| 2021/0305262 | A1* | 9/2021 | Wang ................... | H10B 10/125 |
| 2022/0246739 | A1 | 8/2022 | Xie et al. | |
| 2022/0254681 | A1 | 8/2022 | Morrow et al. | |
| 2023/0095508 | A1 | 3/2023 | Ne et al. | |
| 2023/0139929 | A1 | 5/2023 | Xie et al. | |
| 2023/0206996 | A1 | 6/2023 | Salahuddin et al. | |
| 2024/0178142 | A1* | 5/2024 | Katakam ............ | H10D 84/0186 |

* cited by examiner

X1

X2

Y1

Y2

100

X1

100

X2

100

Y1

100

Y2

X1

X2

Y1

Y2

Y2

Y1

X2

X1

VIA FORMATION ADJACENT A MIDDLE-OF-LINE CONTACT

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming a via adjacent a middle-of-line (MOL) contact.

In one embodiment, a semiconductor device comprises a contact electrically connected to a source/drain region of a transistor and to a gate region of the transistor. A via is disposed along a side of the contact, wherein the via comprises a conductive material. A dielectric liner layer is disposed around at least a portion of the conductive material. The dielectric liner layer electrically isolates the contact from the conductive material, and the via contacts a bit-line.

In another embodiment, a semiconductor device comprises a contact electrically connecting a source/drain region of a transistor with a gate region of the transistor, and a conductive via disposed along a side of the contact. A dielectric liner layer is disposed between the conductive via and the contact. The dielectric liner layer electrically isolates the contact from the conductive via, and the conductive via is disposed on a bit-line.

In another embodiment, a semiconductor device comprises a nanosheet structure comprising a plurality of channel layers and a gate region. An epitaxial source/drain region is disposed on a side of the nanosheet structure, and a contact is disposed on the gate region and the epitaxial source/drain region. The contact electrically connects the epitaxial source/drain region with the gate region. A conductive via is disposed along a side of the contact, and a dielectric liner layer is disposed around at least a portion of the conductive via. The dielectric liner layer electrically isolates the contact from the conductive via. The conductive via is disposed on and contacts a bit-line.

These and other features and advantages of embodiments described herein will become more apparent from the accompanying drawings and the following detailed description.

DETAILED DESCRIPTION

Figure 1A:
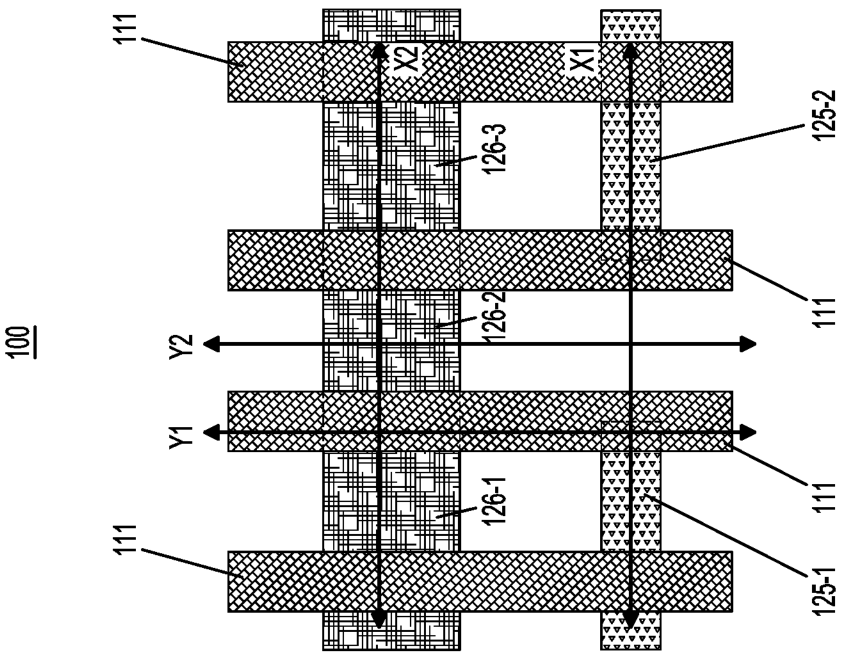
FIG. 1A depicts a top view of a semiconductor structure with lines X1, X2, Y1 and Y2 on which the cross-sectional views of FIGS. 1B-1E are based, according to an embodiment of the invention.
Figure 1E:
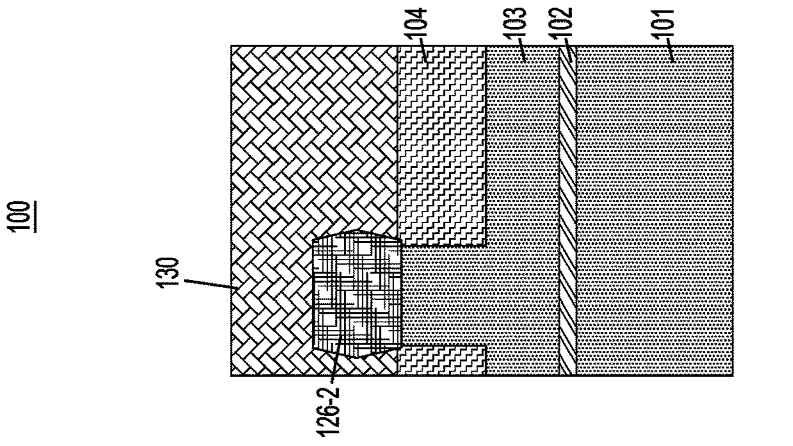
FIG. 1E depicts a fourth cross-sectional view corresponding to the line Y2 in FIG. 1A following nanosheet layer patterning, isolation region formation, dummy gate formation, epitaxial source/drain region formation, ILD layer formation and planarization, according to an embodiment of the invention.

Illustrative embodiments of the invention may be described herein in the context of illustrative methods for forming a via adjacent an MOL contact and forming an isolation structure around the via, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves selectively removing sacrificial layers, which may be formed of silicon germanium (SiGe), between sheets of channel material, which may be formed of silicon (Si).

For continued scaling (e.g., to 2.5 nm and beyond), next-generation stacked FET devices may be used. Next-generation stacked FET devices provide a complex gate-all-around (GAA) structure. Conventional GAA FETs, such as nanosheet FETs, may stack multiple p-type nanowires or nanosheets on top of each other in one device, and may stack multiple n-type nanowires or nanosheets on top of each other in another device. Next-generation stacked FET structures provide improved track height scaling, leading to structural gains (e.g., such as 30-40% structural gains for different types of devices, such as logic devices, static random-access memory (SRAM) devices, etc.). In next-generation stacked FET structures, n-type and p-type nanowires or nanosheets are stacked on each other, eliminating n-to-p separation bottlenecks and reducing the device area footprint. There is, however, a continued desire for further scaling and reducing the size of FETs.

As discussed above, various techniques may be used to reduce the size of FETs, including through the use of fin-shaped channels in FinFET devices, through the use of stacked nanosheet channels formed over a semiconductor substrate, and next-generation stacked FET devices.

Although embodiments of the present invention are discussed in connection with nanosheet stacks, the embodiments of the present invention are not necessarily limited thereto, and may similarly apply to nanowire stacks.

FIG. 1A depicts a top view of a semiconductor structure 100 with lines X1, X2, Y1 and Y2 on which the cross-sectional views of FIGS. 1B-1E are based. FIG. 1A illustrates dummy gate portions 111, p-type source/drain regions 125-1 and 125-2 (collectively "p-type source/drain regions 125") and n-type source/drain regions 126-1, 126-2 and 126-3 (collectively "n-type source/drain regions 126"). Referring to FIG. 1A and to the cross-sectional views in FIGS. 1B, 1C, 1D and 1E, which respectively correspond to the lines X1, X2, Y1 and Y2 in FIG. 1A, a semiconductor structure 100 includes a stacked structure of sacrificial layers 105 and channel layers 107. In an illustrative embodiment, the sacrificial layers 105 comprise silicon germanium (SiGe) and the channel layers 107 comprise silicon. In illustrative embodiments, the sacrificial layers 105 comprise a germanium concentration of about 30% (e.g., SiGe30), but the embodiments are not necessarily limited to SiGe30 for the sacrificial layers 105.

A first semiconductor substrate 101 and a second semiconductor substrate 103 comprise semiconductor material including, but not limited to, silicon, III-V, II-V compound semiconductor materials or other like semiconductor materials. In addition, multiple layers of the semiconductor materials can be used as the semiconductor material of the first and second semiconductor substrates 101 and 103. An etch stop layer 102 is formed on the first semiconductor substrate 101. In an illustrative embodiment, the etch stop layer 102 comprises SiGe (e.g., SiGe30) or silicon dioxide ($SiO_2$) and the first and second semiconductor substrates 101 and 103 comprise silicon.

According to one or more embodiments, the etch stop layer 102 is epitaxially grown on the first semiconductor substrate 101, the second semiconductor substrate 103 is epitaxially grown on the etch stop layer 102 and the sacrificial layers 105 and channel layers 107 are epitaxially grown in an alternating and stacked configuration on the second semiconductor substrate 103. A first sacrificial layer 105 is followed by a first channel layer 107 on the first sacrificial layer 105, which is followed by a second sacrificial layer on the first channel layer 107, and so on. As can be understood, the sacrificial and channel layers 105 and 107 are epitaxially grown from their corresponding underlying semiconductor layers.

While three sacrificial layers 105 and three channel layers 107 are shown, the embodiments of the present invention are not necessarily limited to the shown number of sacrificial and channel layers 105 and 107, and there may be more or less layers in the same alternating configuration depending on design constraints. The sacrificial layers 105, as described further herein, are eventually removed and replaced by gate structures.

Although SiGe is described as a sacrificial material for sacrificial layers 105, other materials can be used as long as the sacrificial layers 105 have the property of being able to be removed selectively compared to the material of the channel layers 107.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a metal-organic chemical vapor deposition (MOCVD), rapid thermal chemical vapor deposition (RT-CVD), ultra-high vacuum chemical vapor deposition (UHVCVD), or a low pressure chemical vapor deposition (LPCVD) apparatus. A number of different sources may be used for the epitaxial deposition of the in situ doped semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

In a non-limiting illustrative embodiment, a height of the sacrificial layers 105 can be in the range of about 6 nm to about 15 nm depending on the application of the device. Also, in a non-limiting illustrative embodiment, a height of the channel layers 107 can be in the range of about 6 nm to about 15 nm depending on the desired process and application. In accordance with an embodiment of the present invention, each of the channel layers 107 has the same or substantially the same composition and size as each other, and each of the sacrificial layers 105 has the same or substantially the same composition and size as each other.

As used herein, "frontside or "first side" refers to a side on top of the second semiconductor substrate 103 and/or in front of, on top of or in an upward direction from the stacked nanosheet/gate and channel layers of the transistors in the orientation shown in the cross-sectional figures. As used herein, "backside" or "second side" refers to a side below the second semiconductor substrate 103 and/or behind, below or in a downward direction from the stacked nanosheet/gate and channel layers of the transistors in the orientation shown in the cross-sectional figures (e.g., opposite the "frontside").

Figure 1D:
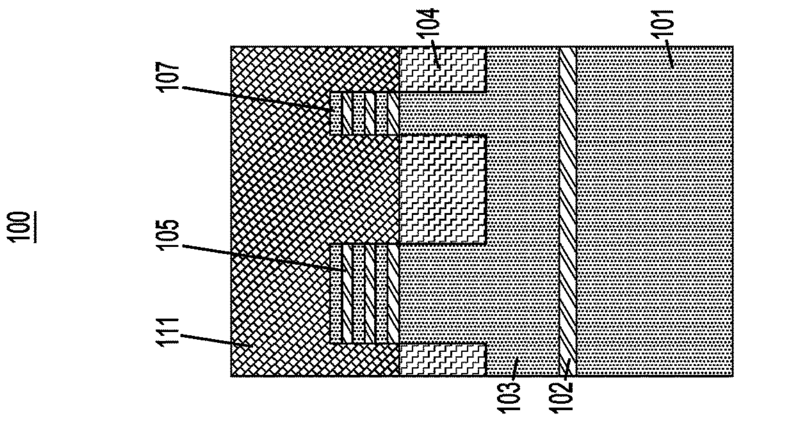
FIG. 1D depicts a third cross-sectional view corresponding to the line Y1 in FIG. 1A following nanosheet layer patterning, isolation region formation, dummy gate formation, epitaxial source/drain region formation, ILD layer formation and planarization, according to an embodiment of the invention.
Figure 1C:
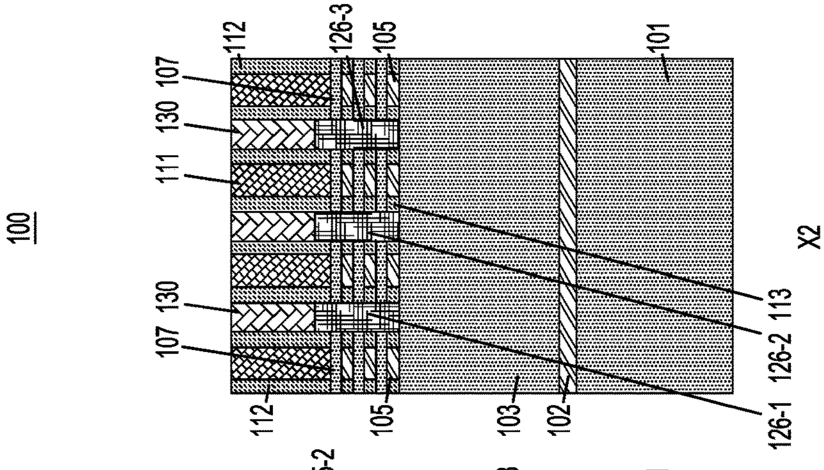
FIG. 1C depicts a second cross-sectional view corresponding to the line X2 in FIG. 1A following nanosheet layer patterning, isolation region formation, dummy gate formation, epitaxial source/drain region formation, ILD layer formation and planarization, according to an embodiment of the invention.
Figure 1B:
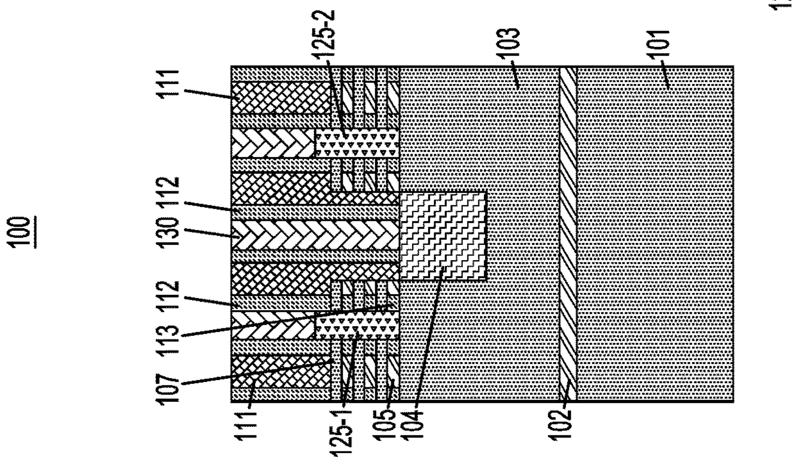
FIG. 1B depicts a first cross-sectional view corresponding to the line X1 in FIG. 1A following nanosheet layer patterning, isolation region formation, dummy gate formation, epitaxial source/drain region formation, inter-layer dielectric (ILD) layer formation and planarization, according to an embodiment of the invention.

Portions of the nanosheet stacks comprising the sacrificial layers 105 and channel layers 107 are removed, and portions of the second semiconductor substrate 103 are recessed. As can be seen in FIGS. 1B and 1D some of the remaining nanosheet stacks corresponding to the p-type source/drain regions 125 are narrower than other remaining nanosheet stacks. Isolation regions 104 (e.g., shallow trench isolation (STI)) regions are formed between the remaining nanosheet stacks in the recessed portions of the second semiconductor substrate 103. Isolation regions 104 comprising dielectric material fill in the recessed portions of the second semiconductor substrate 103. The dielectric material may comprise, for example, $SiO_2$, silicon nitride (SiN), silicon oxynitride (SiON), silicon-carbon-nitride (SiCN), boron nitride (BN), silicon boron nitride (SiBN), silicoboron carbonitride (SiBCN), silicon oxycarbonitride (SiOCN) and combinations thereof, and is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD).

Dummy gate portions 111 are formed on the uppermost channel layers 107 and around the stacked nanosheet configurations of the sacrificial layers 105 and channel layers 107. The dummy gate portions 111 include, but are not necessarily limited to, an amorphous silicon (a-Si) layer. The dummy gate portions 111 are deposited using deposition techniques such as, for example, CVD, PECVD, RFCVD, PVD, ALD, MBD, PLD, LSMCD, sputtering and/or plating, followed by a planarization process, such as, chemical mechanical planarization (CMP), and lithography and etching steps to remove excess dummy gate material, and pattern the deposited layer. In some areas, parts of the dummy gate portions are directly formed on the isolation regions 104.

Gate spacers 112 are formed on sides of the dummy gate portions 111 by one or more of the deposition techniques noted in connection with deposition of the dummy gate material. The spacer material can comprise for example, one or more dielectrics, including, but not necessarily limited to, SiN, SiON, SiOC, SiCN, BN, SiBN, SiBCN, SiOCN, SiOx, and combinations thereof. The gate spacers 112 can be formed by any suitable techniques such as deposition followed by directional etching. Deposition may include but is not limited to, ALD or CVD. Directional etching may include but is not limited to, reactive ion etching (RIE). As can be seen in FIG. 1B, some of the gate spacers 112 extend down to contact an isolation region 104. These gate spacers 112 are disposed on sides of dummy gate portions 111 that also extend down to and land on an isolation region 104 and/or on part of the second semiconductor substrate 103.

Exposed portions of the stacked sacrificial layers 105 and channel layers 107, which are not under hardmask layers (not shown), gate spacers 112 and dummy gate portions 111, are removed using, for example, an etching process, such as RIE, where the hardmask layers, gate spacers 112 and dummy gate portions 111 are used as a mask. Portions of the stacked structures of sacrificial layers 105 and channel layers 107 under the hardmask layers, under the gate spacers 112 and under the dummy gate portions 111 remain after the etching process. Portions of the sacrificial layers 105 and channel layers 107 in areas that correspond to where the p-type source/drain regions 125 and n-type source/drain regions 126 are eventually formed are removed.

Due to, for example, germanium in the sacrificial layers 105, lateral etching of the sacrificial layers 105 can be performed selective to the channel layers 107, such that the side portions of the sacrificial layers 105 can be removed to create vacant areas to be filled in by inner spacers 113. The material of the inner spacers 113 can comprise, but is not necessarily limited to, a nitride, such as, SiN, SiON, SiCN, BN, SiBN, SiBCN or SiOCN. Gate spacers 112 are positioned on the nanosheet stacks on opposite lateral sides of the dummy gate portions 111. In an illustrative embodiment, the gate spacers 112 are formed from the same or similar material to that of the inner spacers 113. Like the gate spacers 112, the inner spacers 113 can be formed by any suitable techniques such as deposition followed by directional etching.

The p-type source/drain regions 125 and the n-type source/drain regions 126 are grown from the exposed portions of the second semiconductor substrate 103 and from exposed side portions of the channel layers 107 in an epitaxial growth process. Side surfaces of respective ones of the channel layers 107 contact a side surface at least one adjacent p-type source/drain region 125 or n-type source/drain region 126. The top surfaces of the p-type source/drain regions 125 and n-type source/drain regions 126 are above the top surfaces of uppermost ones of the channel layers 107.

According to a non-limiting embodiment of the present invention, the conditions of the epitaxial growth process for the p-type source/drain regions 125 and n-type source/drain regions 126 are, for example, RTCVD epitaxial growth using $SiH_4$, $SiH_2Cl_2$, $GeH_4$, $CH_3SiH_3$, $B_2H_6$, $PF_3$, and/or $H_2$ gases with temperature and pressure ranges of about 450° C. to about 800° C., and about 5 Torr-about 300 Torr. In the case of n-type FETS (nFETs), the n-type source/drain regions 126 can comprise silicon doped with n-type dopants including, for example, phosphorus (P), arsenic (As) and antimony (Sb). In the case of p-type FETS (pFETs), the p-type source/drain regions 125 can comprise silicon doped with n-type dopants including, for example, boron (B), boron fluoride ($BF_2$), gallium (Ga), indium (In), and thallium (Tl).

An inter-layer dielectric (ILD) layer 130 is deposited to fill in portions on and around the p-type source/drain regions 125 and n-type source/drain regions 126. The ILD layer 130 further fills in portions between gate spacers 112 that extend down to the second semiconductor substrate 103 and/or an isolation region 104. For example, as can be seen in FIG. 1B, a portion of the ILD layer 130 is formed on and contacts a top surface of an isolation region 104 between two gate spacers 112 formed on and contacting the top surface of the isolation region 104. The ILD layer 130 is deposited using deposition techniques such as, for example, CVD, PECVD, RFCVD, PVD, ALD, MBD, PLD, and/or LSMCD, followed by a planarization process, such as, chemical mechanical planarization (CMP) to remove excess portions of the ILD layer 130 deposited on top of hardmask layers and/or gate spacers 112, and to remove hardmask layers and portions of the gate spacers 112 to expose the dummy gate portions 111. The ILD layer 130 may comprise, for example, SiOx, SiOC, SiOCN or some other dielectric.

Figure 2A:
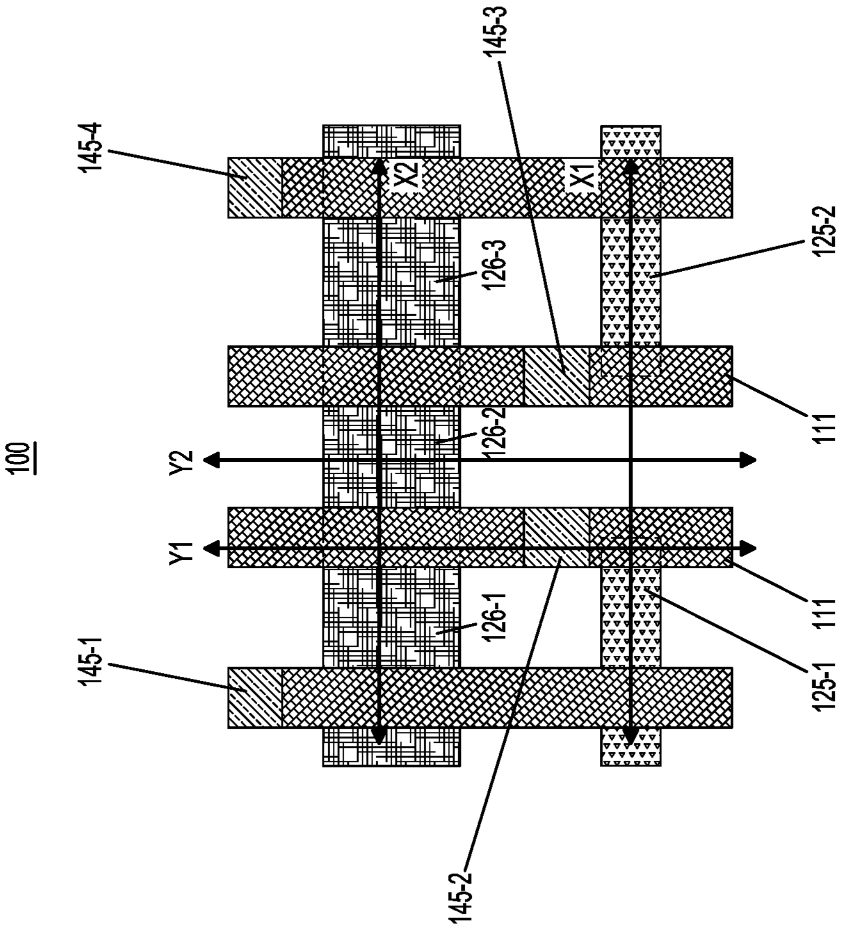
FIG. 2A depicts a top view of a semiconductor structure with lines X1, X2, Y1 and Y2 on which the cross-sectional views of FIGS. 2B-2E are based, according to an embodiment of the invention.
Figures 2B, 2C, 2D, 2E:
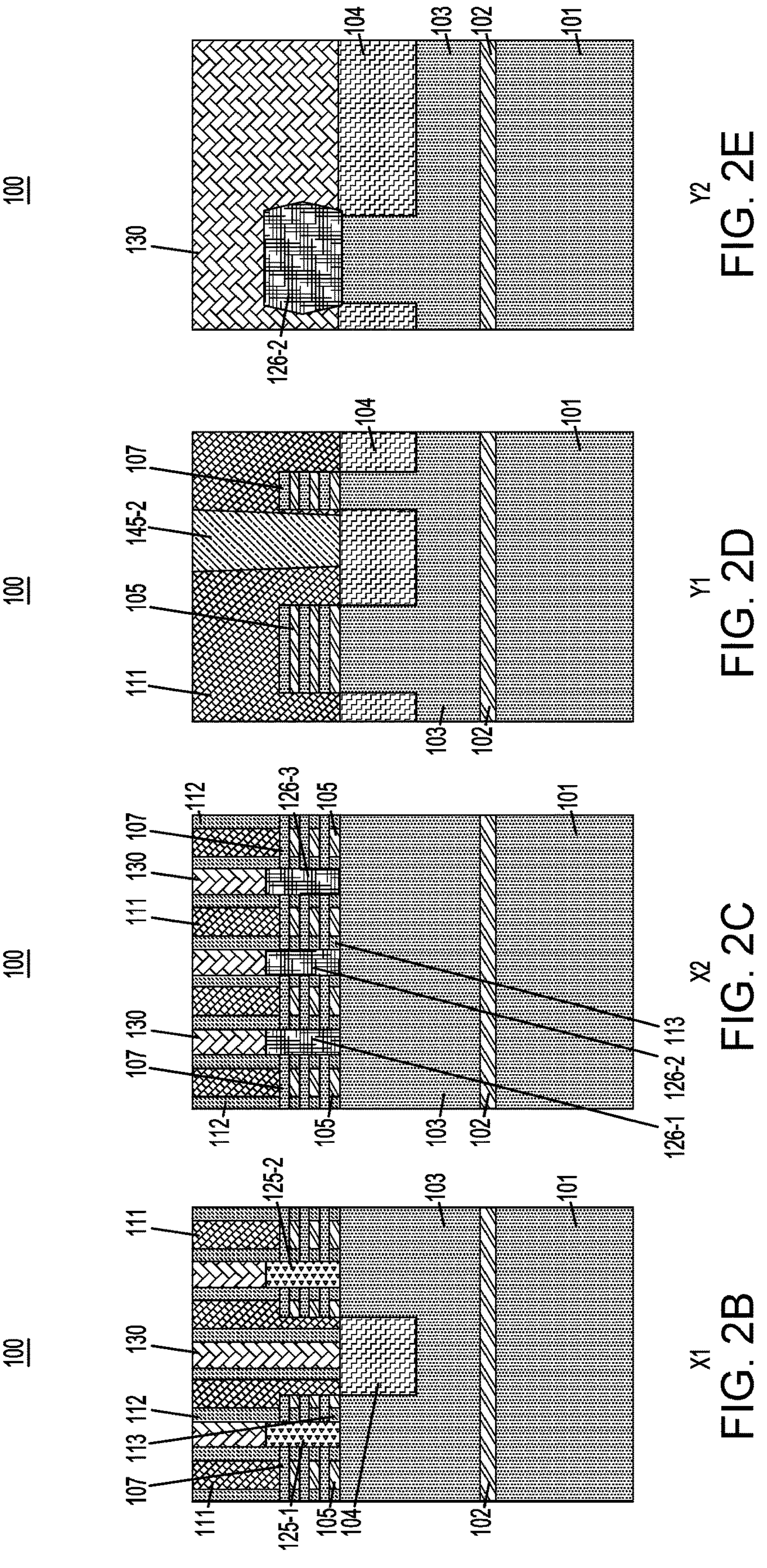
FIG. 2B depicts a first cross-sectional view corresponding to the line X1 in FIG. 2A following gate cut formation, according to an embodiment of the invention.
FIG. 2C depicts a second cross-sectional view corresponding to the line X2 in FIG. 2A following gate cut formation, according to an embodiment of the invention.
FIG. 2D depicts a third cross-sectional view corresponding to the line Y1 in FIG. 2A following gate cut formation, according to an embodiment of the invention.
FIG. 2E depicts a fourth cross-sectional view corresponding to the line Y2 in FIG. 2A following gate cut formation, according to an embodiment of the invention.

Referring to FIG. 2A and to the cross-sectional views in FIGS. 2B, 2C, 2D and 2E, which respectively correspond to the lines X1, X2, Y1 and Y2 in FIG. 2A, parts of the dummy gate portions 111 between the nanosheet stacks comprising the channel layers 107 and sacrificial layers 105, and between the p-type source/drain regions 125 and n-type source/drain regions 126 are removed down to isolation regions 104 to form trenches in which dielectric material is deposited to form gate cut portions 145-1, 145-2, 145-3 and 145-4 (collectively "gate cut portions 145"). The parts of the dummy gate portions 111 are etched using, for example, RIE. The dielectric material of the gate cut portions 145 is deposited using deposition techniques such as, for example, CVD, PECVD, RFCVD, PVD, ALD, MBD, PLD, and/or LSMCD, followed by a planarization process, such as, CMP to remove excess portions of the dielectric material deposited on top of the dummy gate portions 111 and/or ILD layer 130. The dielectric material of the gate cut portions 145 may comprise, but is not necessarily limited to, SiN, SiC, SiON, SiOC, SiCN, BN, SiBN, SiBCN, SiOCN, SiOx or some other dielectric.

Figure 3A:
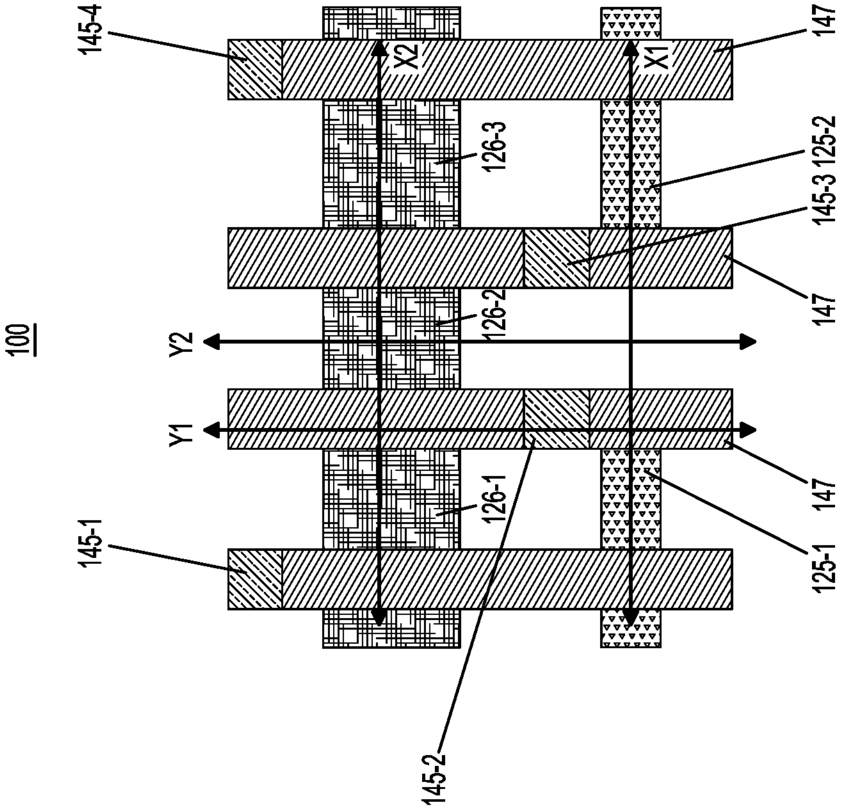
FIG. 3A depicts a top view of a semiconductor structure with lines X1, X2, Y1 and Y2 on which the cross-sectional views of FIGS. 3B-4D are based, according to an embodiment of the invention.

Referring to FIG. 3A and to the cross-sectional views in FIGS. 3B, 3C, 3D and 3E, which respectively correspond to the lines X1, X2, Y1 and Y2 in FIG. 3A, the dummy gate portions 111 are selectively removed to create vacant areas where gate structures will be formed in place of the dummy gate portions 111. The selective removal can be performed using, for example, hot ammonia to remove a-Si. In addition, the sacrificial layers 105 are selectively removed to create vacant areas where gate structures will be formed in place of the sacrificial layers 105. The sacrificial layers 105 are selectively removed with respect to the channel layers 107. The selective removal can be performed using, for example, a dry HCl etch.

Following removal of the dummy gate portions 111 and sacrificial layers 105, the channel layers 107 are suspended, and gate regions 140, including, for example, gate and dielectric portions are formed in the vacant portions left by removal of the dummy gate portions 111, and the sacrificial layers 105. In illustrative embodiments, each gate region 140 includes a gate dielectric layer such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum oxide). Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate regions 140 each include a metal gate portion including a work-function metal (WFM) layer, including but not necessarily limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer. The metal gate portions can also each further include a gate metal layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer. It should be appreciated that various other materials may be used for the metal gate portions as desired.

Figures 3B, 3C, 3D, 3E:
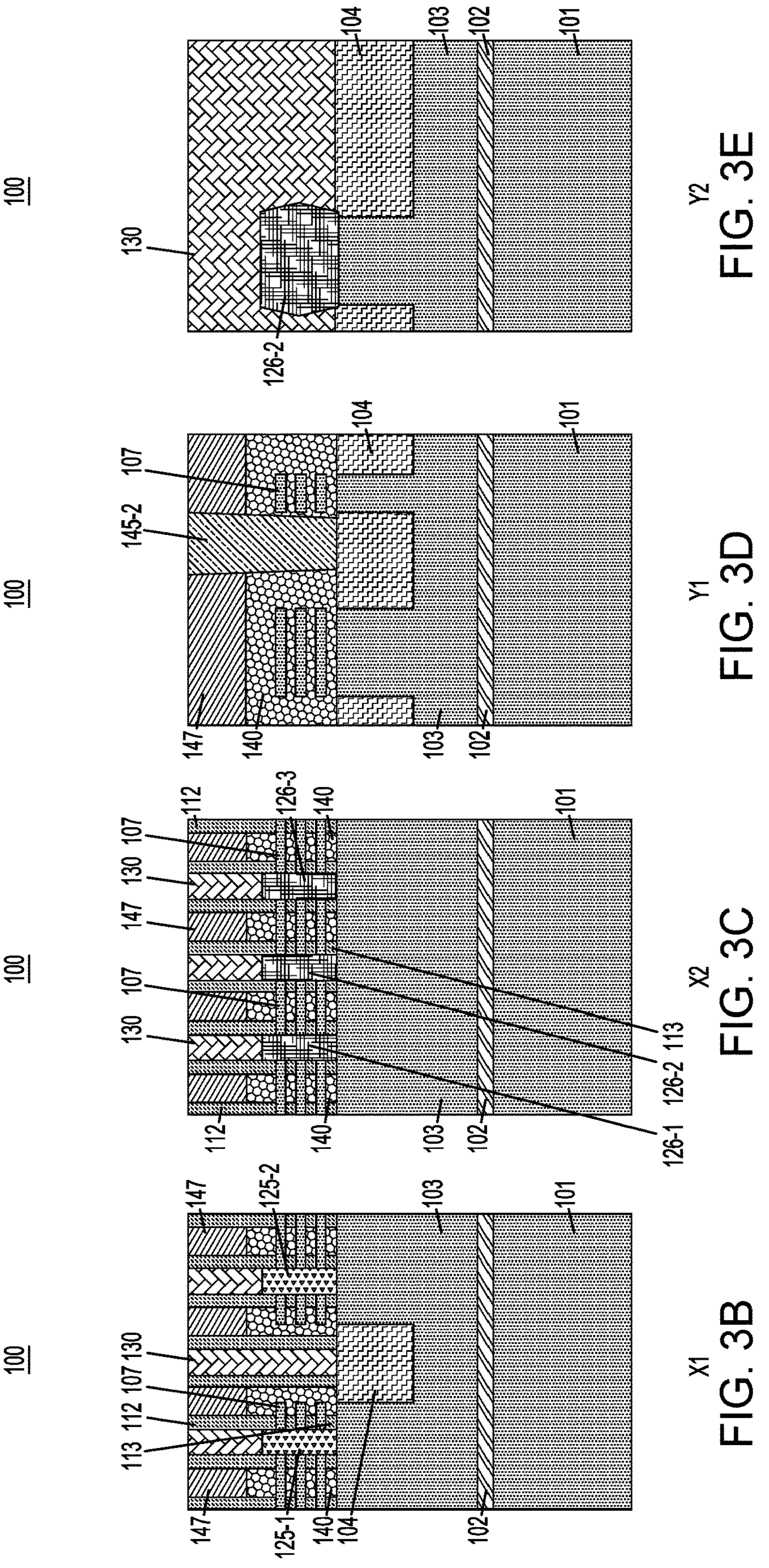
FIG. 3B depicts a first cross-sectional view corresponding to the line X1 in FIG. 3A following replacement metal gate (RMG) formation and self-aligned contact (SAC) cap layer formation, according to an embodiment of the invention.
FIG. 3C depicts a second cross-sectional view corresponding to the line X2 in FIG. 3A following RMG formation and SAC cap layer formation, according to an embodiment of the invention.
FIG. 3D depicts a third cross-sectional view corresponding to the line Y1 in FIG. 3A following RMG formation and SAC cap layer formation, according to an embodiment of the invention.
FIG. 3E depicts a fourth cross-sectional view corresponding to the line Y2 in FIG. 3A following RMG formation and SAC cap layer formation, according to an embodiment of the invention.
Figure 4A:
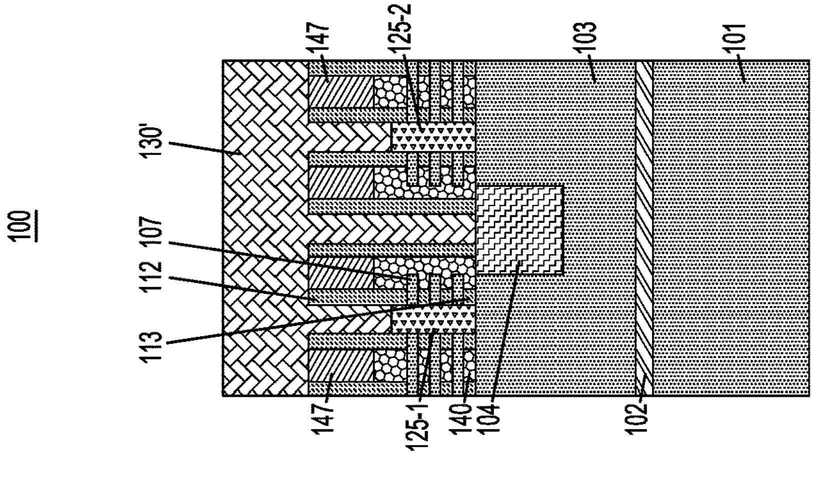
FIG. 4A depicts a first cross-sectional view corresponding to the line X1 in FIG. 3A following additional ILD layer formation, according to an embodiment of the invention.
Figure 4B:
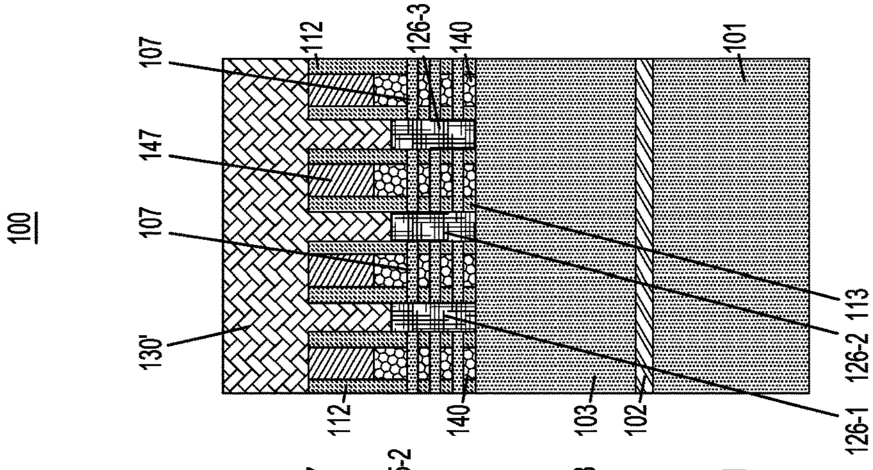
FIG. 4B depicts a second cross-sectional view corresponding to the line X2 in FIG. 3A following additional ILD layer formation, according to an embodiment of the invention.
Figure 4C:
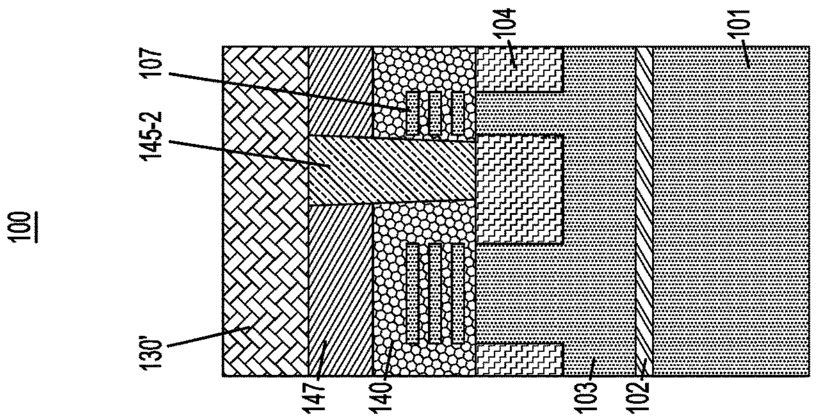
FIG. 4C depicts a third cross-sectional view corresponding to the line Y1 in FIG. 3A following additional ILD layer formation, according to an embodiment of the invention.
Figure 4D:
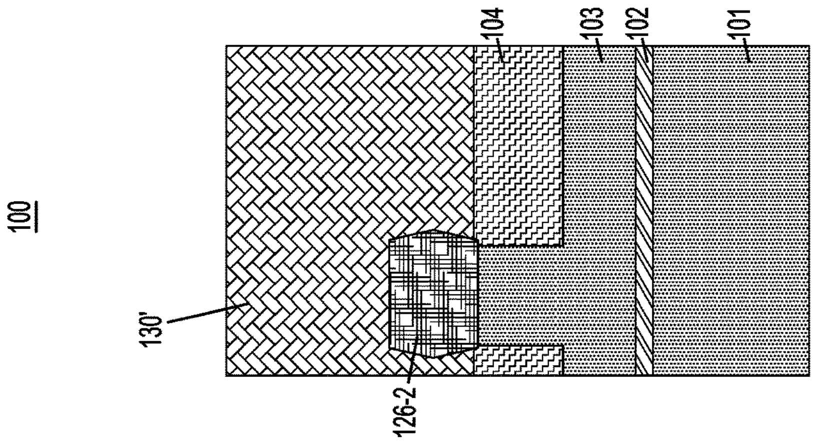
FIG. 4D depicts a fourth cross-sectional view corresponding to the line Y2 in FIG. 3A following additional ILD layer formation, according to an embodiment of the invention.

As can be seen in FIGS. 3B and 3D, portions of the gate regions 140 are formed around exposed ends of the channel layers 107 and extend down onto a top surface of an isolation region 104 and/or the second semiconductor substrate 103.

In addition to the gate regions 140, self-aligned contact (SAC) cap layers 147 are formed in place of upper parts of the dummy gate portions 111. The SAC cap layers 147 include, but are not necessarily limited to, silicon SiN, SiBN, SiBCN or SiOCN. According to an embodiment of the present invention, the SAC cap layers 147 are deposited on top surfaces of the gate regions 140 using, for example, deposition techniques including, but not limited to, CVD, PECVD, RFCVD, PVD, ALD, MLD, MBD, PLD, LSMCD, sputtering, and/or plating, followed by a planarization process, such as, for example, CMP. As can be seen in FIGS. 3B and 3C, some of the SAC cap layers 147 are formed between gate spacers 112. One or more of the SAC cap layers 147 and gate regions 140 are formed on sides of a gate cut portion 145. For example, referring to FIG. 3D, gate cut portion 145-2 is formed through an SAC cap layer 147 and underlying gate region 140.

Referring to FIGS. 4A-4D, additional ILD material is deposited to form an additional ILD layer 130' on top of the ILD layer 130. In more detail, the additional ILD material is deposited on exposed top surfaces of the SAC cap layers 147, of the gate cut portions 145 and of the ILD layer 130. In illustrative embodiments, the additional ILD material includes the same material as or a similar material to the ILD layer 130 and is deposited using deposition techniques such as, for example, CVD, PECVD, RFCVD, PVD, ALD, MBD, PLD, and/or LSMCD, which may be followed by a planarization process, such as, CMP.

Figure 5A:
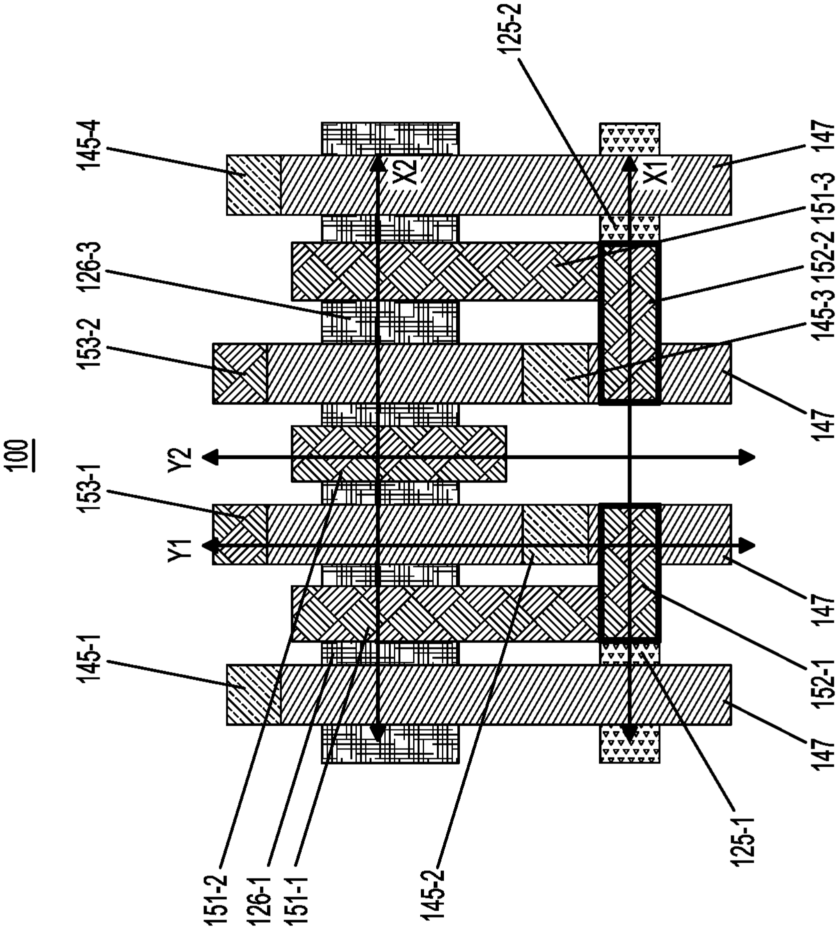
FIG. 5A depicts a top view of a semiconductor structure with lines X1, X2, Y1 and Y2 on which the cross-sectional views of FIGS. 5B-5E are based, according to an embodiment of the invention.
Figure 5E:
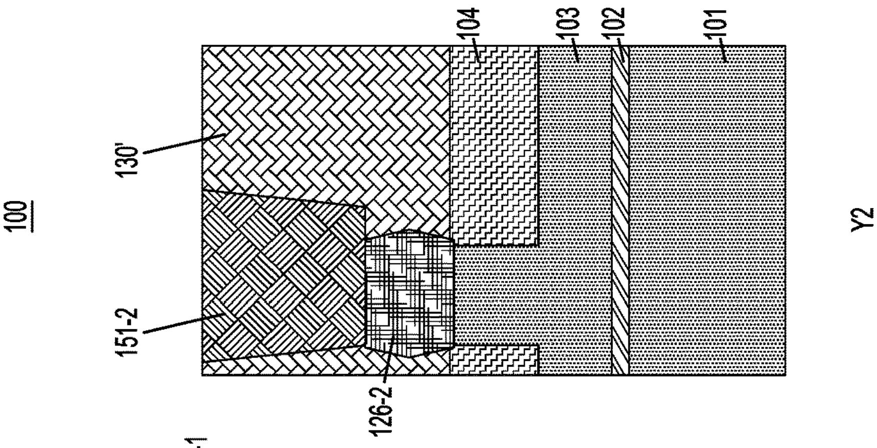
FIG. 5E depicts a fourth cross-sectional view corresponding to the line Y2 in FIG. 5A following source/drain contact, gate contact and cross-couple contact formation, according to an embodiment of the invention.
Figure 5D:
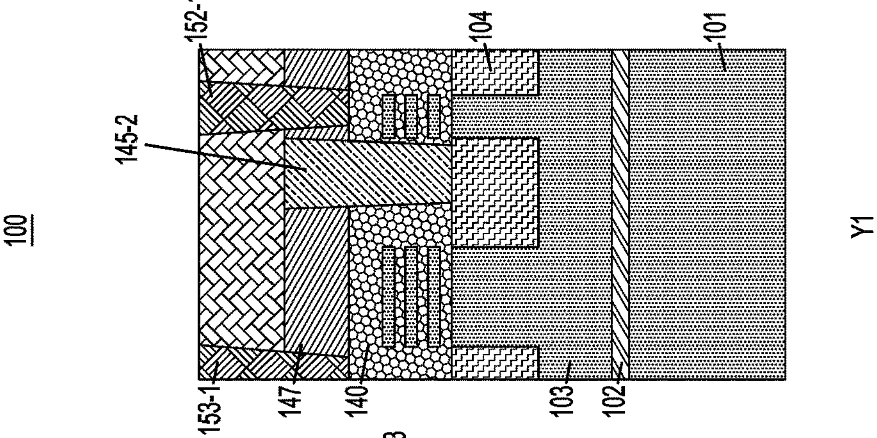
FIG. 5D depicts a third cross-sectional view corresponding to the line Y1 in FIG. 5A following source/drain contact, gate contact and cross-couple contact formation, according to an embodiment of the invention.
Figure 5C:
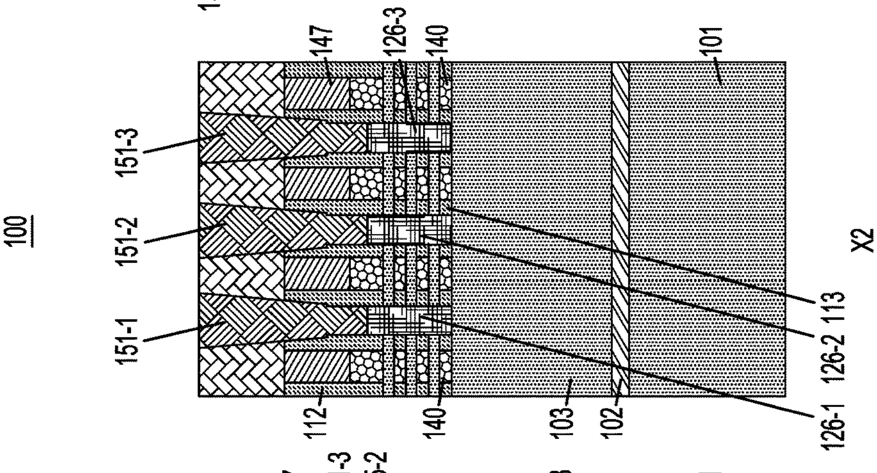
FIG. 5C depicts a second cross-sectional view corresponding to the line X2 in FIG. 5A following source/drain contact, gate contact and cross-couple contact formation, according to an embodiment of the invention.

Referring to FIG. 5A and to the cross-sectional views in FIGS. 5B, 5C, 5D and 5E, which respectively correspond to the lines X1, X2, Y1 and Y2 in FIG. 5A, source/drain contacts 151-1, 151-2 and 151-3 (collectively "source/drain contacts 151"), cross-couple contacts 152-1 and 152-2 (collectively "cross-couple contacts 152") and gate contacts 153-1 and 153-2 (collectively "gate contacts 153") are formed in the ILD layers 130 and 130' and through portions of the SAC cap layers 147.

Figure 5B:
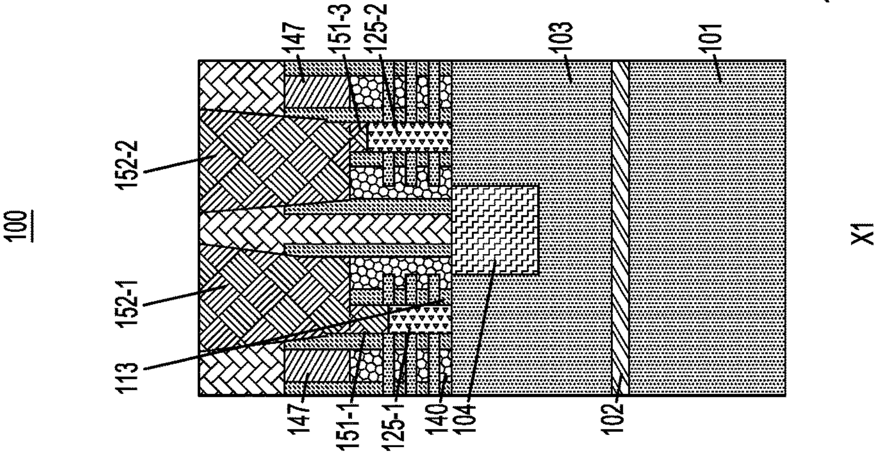
FIG. 5B depicts a first cross-sectional view corresponding to the line X1 in FIG. 5A following source/drain contact, gate contact and cross-couple contact formation, according to an embodiment of the invention.

In forming the source/drain contacts 151, portions of the gate spacers 112, SAC cap layers 147 and ILD layers 130 and 130' are removed to form openings (e.g., trenches) exposing portions of the p-type source/drain regions 125 and n-type source/drain regions 126 on which the source/drain contacts 151 are to be formed. In forming the cross-couple contacts 152, portions of the gate spacers 112, SAC cap layers 147 and ILD layers 130 and 130' adjacent the parts of the openings exposing the p-type source/drain regions 125 are removed to form merged openings exposing portions of the p-type source/drain regions 125 and adjacent gate regions 140. As can be seen in FIGS. 5A and 5B, the merged openings are filled with conductive material (e.g., metals listed herein below) to form the cross-couple contacts 152-1 and 152-2, which electrically connect (e.g., short) the p-type source/drain regions 125-1 and 125-2 with corresponding adjacent gate regions 140 of nanosheet pFETs. As explained in more detail below, the formation of the cross-couple contacts like the cross-couple contacts 152 is needed for formation of SRAM devices. The cross-couple contacts 152-1 and 152-2 are formed on and contact their corresponding underlying gate regions 140. The cross-couple contacts 152-1 and 152-2 are further respectively formed over the p-type source/drain regions 125-1 and 125-2. In more detail, the cross-couple contacts 152-1 and 152-2 are respectively formed on portions of corresponding source/drain contacts 151-1 and 151-3, and the portions of the corresponding source/drain contacts 151-1 and 151-3 are respectively formed on the p-type source/drain regions 125-1 and 125-2. The cross-couple contacts contact the p-type source/drain regions 125-1 and 125-2 through the corresponding source/drain contacts 151-1 and 151-3.

Referring to FIG. 5A, the source/drain contacts 151-1 and 151-3 are further connected to n-type source/drain regions 126-1 and 126-3, respectively. As a result, the p-type source/drain region 125-1 and n-type source/drain region 126-1 are electrically connected to each other and to the adjacent gate region 140 via the cross-couple contact 152-1, and the p-type source/drain region 125-2 and n-type source/drain region 126-3 are electrically connected to each other and to the adjacent gate region 140 via the cross-couple contact 152-2. These cross-couple contacts 152, which respectively connect both an n-type source/drain region and a p-type source/drain region to a gate, are needed to form SRAM devices. The other source/drain contact 151-2 is formed on and contacts the n-type source/drain region 126-2.

The gate contacts 153-1 and 153-2 are disposed on and contact respective gate regions 140 formed on opposite sides of the n-type source/drain region 126-2. Similar to the source/drain contacts 151 and cross-couple contacts 152, the gate contacts 153 are formed by removing portions of the gate spacers 112, SAC cap layers 147 and ILD layers 130 and 130' to form openings (e.g., trenches) exposing portions of the underlying gate regions 140.

According to an embodiment, masks are formed on parts of the additional ILD layer 130', and exposed portions of the ILD layers 130 and 130', SAC cap layers 147 and gate spacers 112 corresponding to where the openings are to be formed are removed using, for example, a dry etching process using a RIE or ion beam etch (IBE) process, a wet chemical etch process or a combination of these etching processes. A dry etch may be performed using a plasma. Such wet or dry etch processes include, for example, IBE by Ar/CHF3 based chemistry.

Metal layers are deposited in the openings to form the source/drain contacts 151, cross-couple contacts 152 and gate contacts 153. The metal layers comprise, for example, a silicide layer, such as Ni, Ti, NiPt, etc., a metal adhesion layer, such as TiN, and a conductive metal fill layer, such as W, Al, Co, Ru, etc., and can be deposited using, for example, a deposition technique such as CVD, PECVD, RFCVD, PVD, ALD, MBD, PLD, LSMCD, sputtering and/or plating, followed by a planarization process such as, CMP to remove excess portions of the metal layers from on top of the additional ILD layer 130'.

Forming the gate cut portions 145 prior to RMG processing can ensure gate cut portions 145 are self-aligned to a gate, so even if gate cut lithography has misalignment errors, gate cut portions 145 will only be formed in a gate region 140, not over an ILD region between gates. This avoids contact RIE open issues due to the presence of the gate cut dielectric material (e.g., upper portion of a gate cut region (like upper portion of gate cut portion 145-2)) over a gate region 140 and through part of an SAC cap layer 147.

Figure 6A:
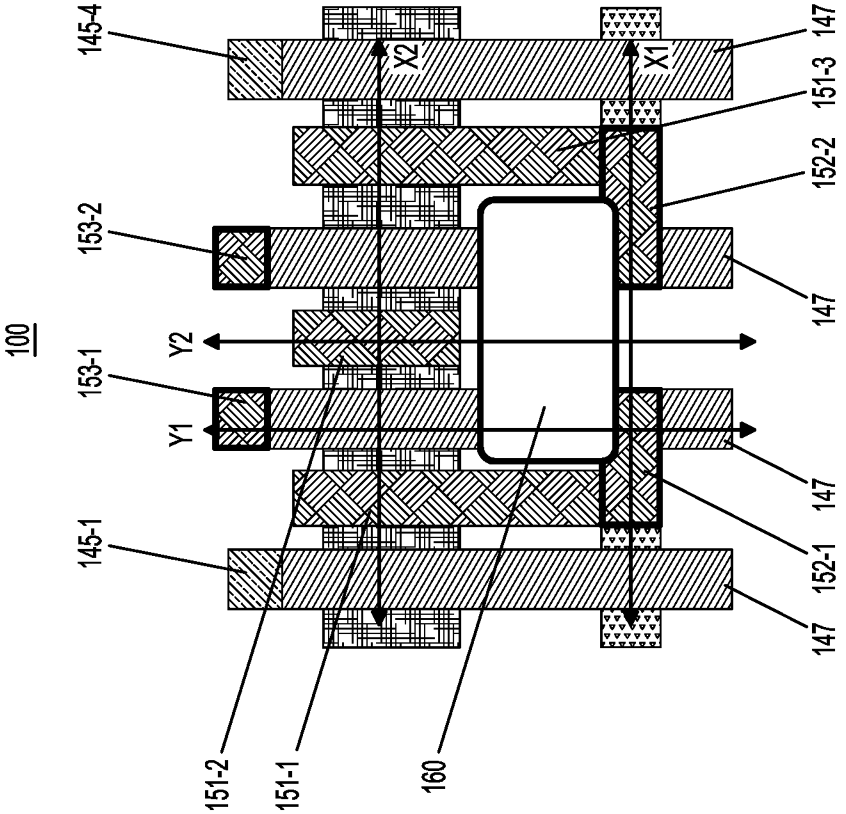
FIG. 6A depicts a top view of a semiconductor structure with lines X1, X2, Y1 and Y2 on which the cross-sectional views of FIGS. 6B-6E are based, according to an embodiment of the invention.
Figure 6B:
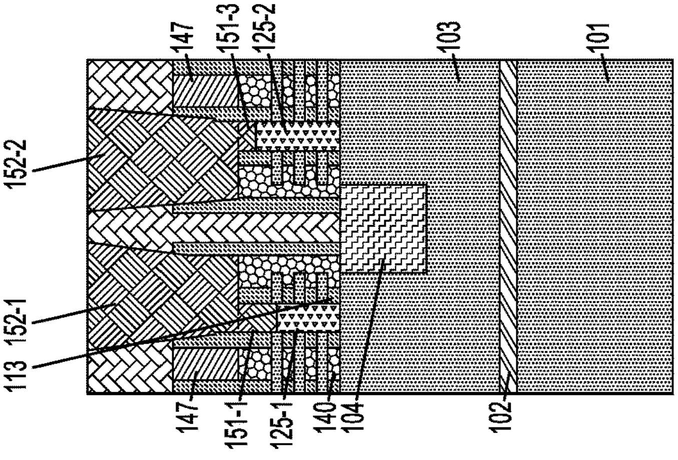
FIG. 6B depicts a first cross-sectional view corresponding to the line X1 in FIG. 6A following deep via patterning, according to an embodiment of the invention.
Figure 6C:
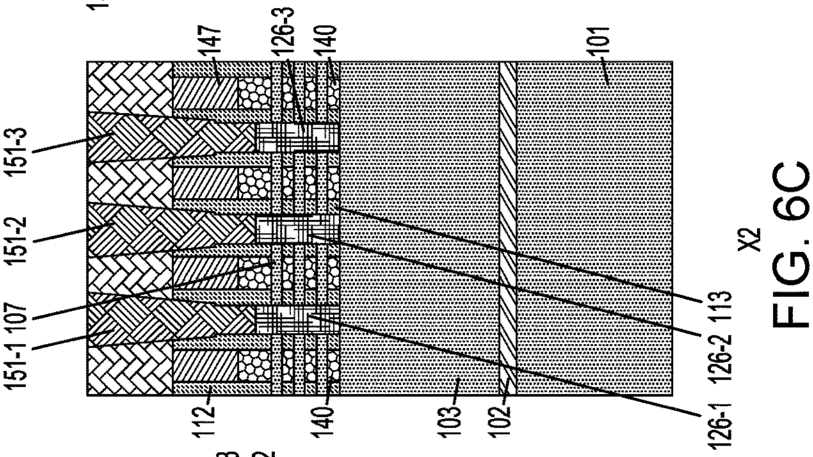
FIG. 6C depicts a second cross-sectional view corresponding to the line X2 in FIG. 6A following deep via patterning, according to an embodiment of the invention.
Figure 6D:
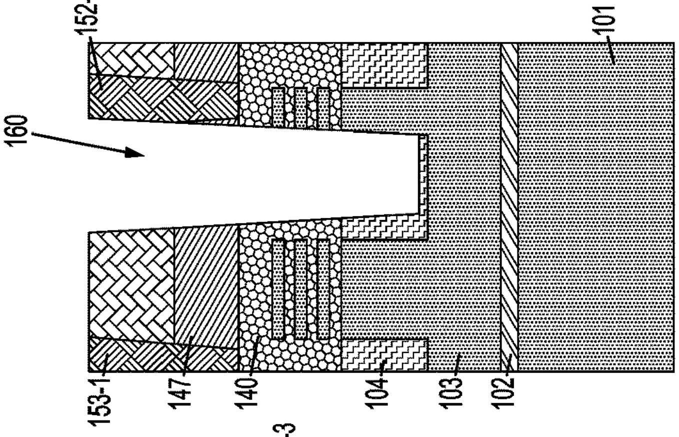
FIG. 6D depicts a third cross-sectional view corresponding to the line Y1 in FIG. 6A following deep via patterning, according to an embodiment of the invention.
Figure 6E:
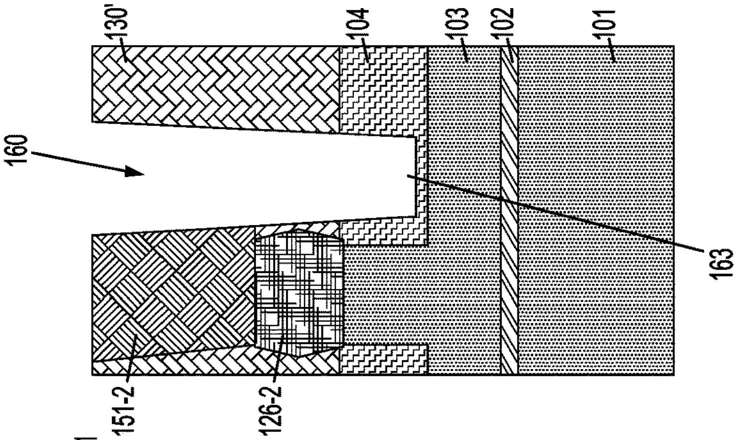
FIG. 6E depicts a fourth cross-sectional view corresponding to the line Y2 in FIG. 6A following deep via patterning, according to an embodiment of the invention.

Referring to FIG. 6A and to the cross-sectional views in FIGS. 6B, 6C, 6D and 6E, which respectively correspond to the lines X1, X2, Y1 and Y2 in FIG. 6A, an opening 160 (e.g., trench) for a deep via is formed. According to an embodiment, masks are formed on parts of the semiconductor structure 100 from FIGS. 5A-5E, and exposed portions of the ILD layers 130' and 130, source/drain contact 151-2, cross-couple contacts 152-1 and 152-2, SAC cap layers 147, gate cut portions 145-2 and 145-3, gate region 140 and isolation region 104 corresponding to where the opening 160 is to be formed are removed using, for example, a dry etch process. Side surfaces of the gate region 140 and side surfaces of channel layers 107 of a nanosheet structure are exposed by the opening 160. As can be seen, the opening 160 extends from a frontside of the semiconductor structure 100 to a backside of the semiconductor structure 100. As explained in more detail herein, due to subsequent formation of a dielectric liner layer, the opening 160 can be made relatively large without concern that the resulting deep via will contact source/drain contacts and/or cross-couple contacts 152 unless designed to do so.

Figure 7A:
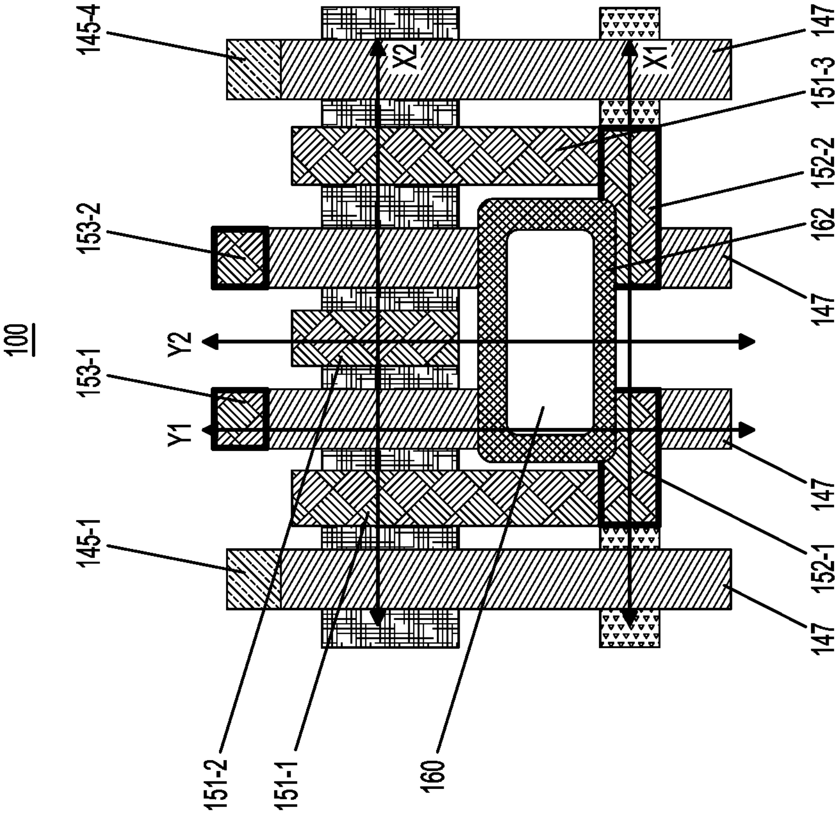
FIG. 7A depicts a top view of a semiconductor structure with lines X1, X2, Y1 and Y2 on which the cross-sectional views of FIGS. 7B-7E are based, according to an embodiment of the invention.
Figures 7B, 7C, 7D, 7E:
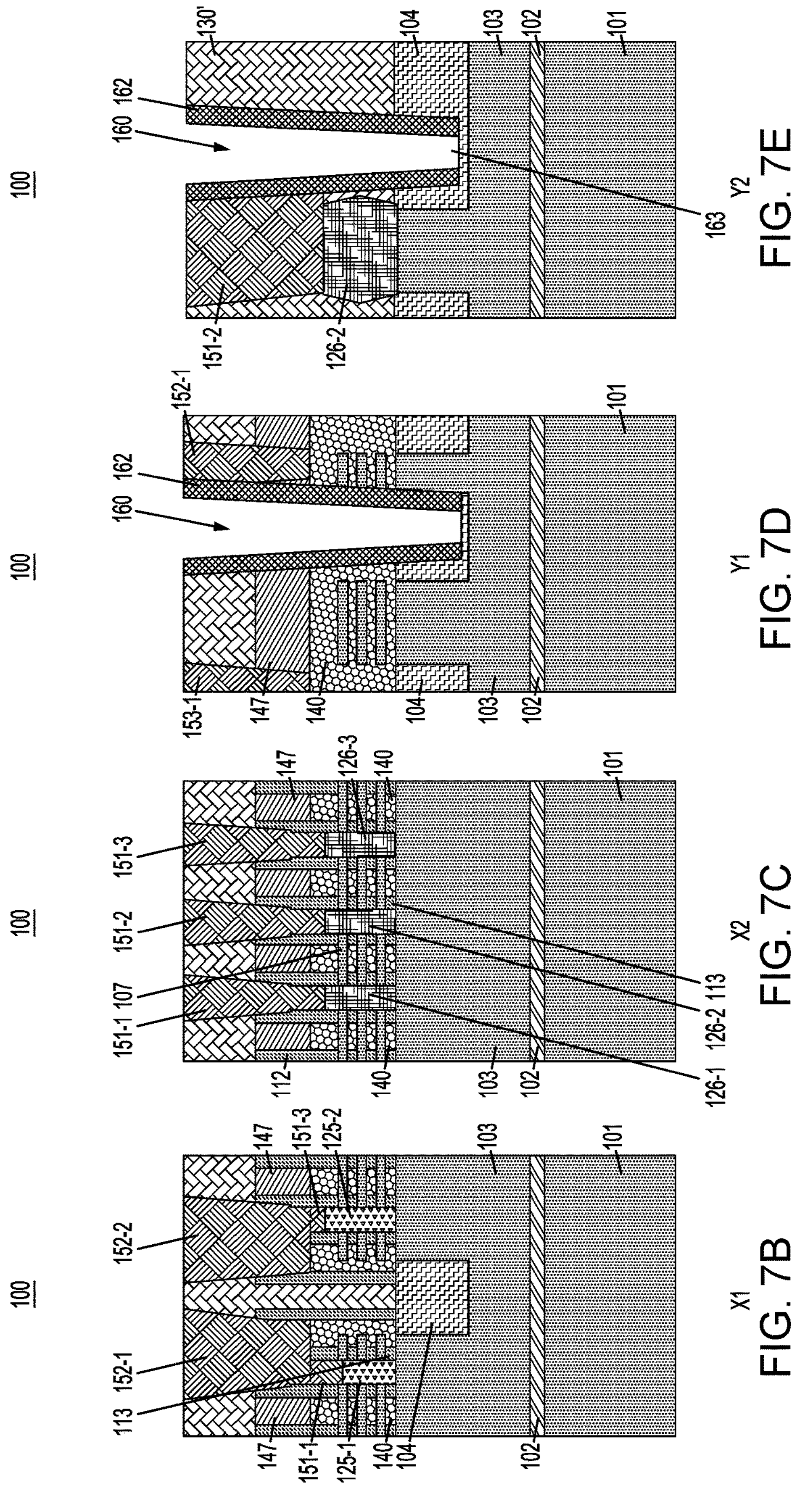
FIG. 7B depicts a first cross-sectional view corresponding to the line X1 in FIG. 7A following dielectric liner layer formation, according to an embodiment of the invention.
FIG. 7C depicts a second cross-sectional view corresponding to the line X2 in FIG. 7A following dielectric liner layer formation, according to an embodiment of the invention.
FIG. 7D depicts a third cross-sectional view corresponding to the line Y1 in FIG. 7A following dielectric liner layer formation, according to an embodiment of the invention.
FIG. 7E depicts a fourth cross-sectional view corresponding to the line Y2 in FIG. 7A following dielectric liner layer formation, according to an embodiment of the invention.

Referring to FIG. 7A and to the cross-sectional views in FIGS. 7B, 7C, 7D and 7E, which respectively correspond to the lines X1, X2, Y1 and Y2 in FIG. 7A, a dielectric liner layer 162 is formed on sides of the opening 160 to surround an outer wall of the opening 160. The dielectric liner material can comprise for example, one or more dielectrics, including, but not necessarily limited to, SiN, SiON, SiOC, SiCN, BN, SiBN, SiBCN, SIOCN, SiOx, and combinations thereof. The dielectric liner layer 162 can be formed by any suitable techniques such as deposition followed by directional etching. Deposition may include but is not limited to, ALD or CVD. Directional etching may include but is not limited to, RIE. As can be seen in FIGS. 7A, 7D and 7E, the dielectric liner layer 162 is formed on exposed portions of source/drain contact 151-2, cross-couple contacts 152-1 and 152-2, gate region 140 and channel layers 107. A portion of a bottom surface of the opening 160 remains exposed after RIE of the dielectric liner material.

Figure 8A:
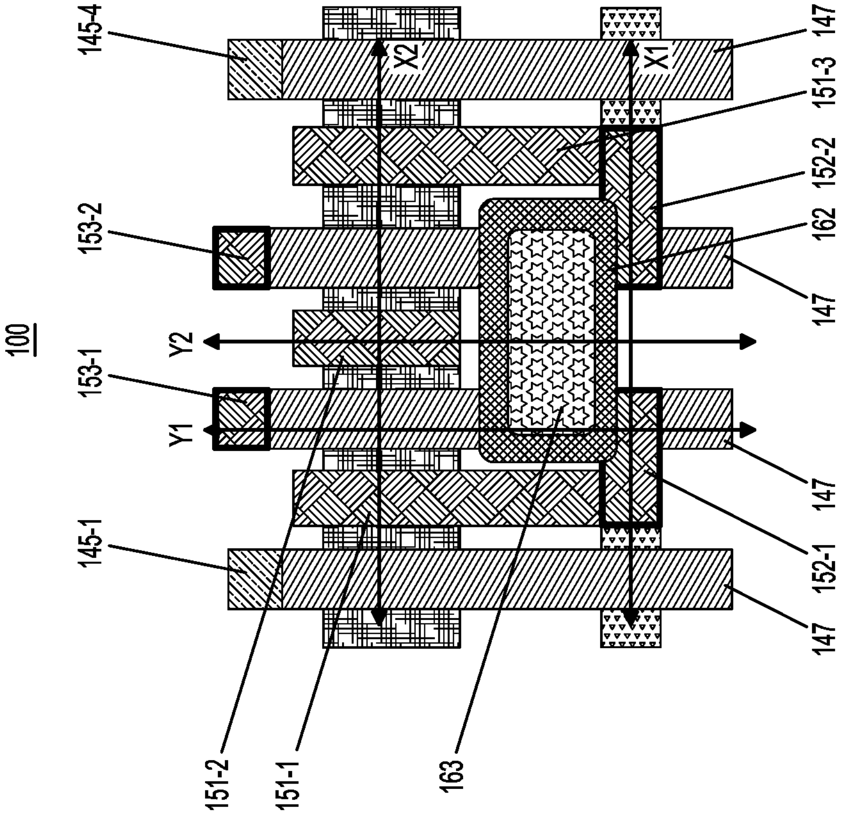
FIG. 8A depicts a top view of a semiconductor structure with lines X1, X2, Y1 and Y2 on which the cross-sectional views of FIGS. 8B-8E are based, according to an embodiment of the invention.
Figure 8E:
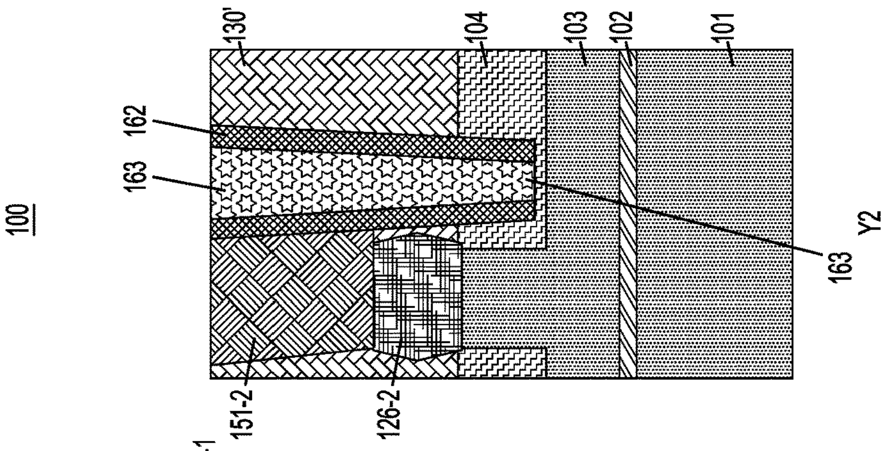
FIG. 8E depicts a fourth cross-sectional view corresponding to the line Y2 in FIG. 8A following OPL formation, according to an embodiment of the invention.
Figure 8D:
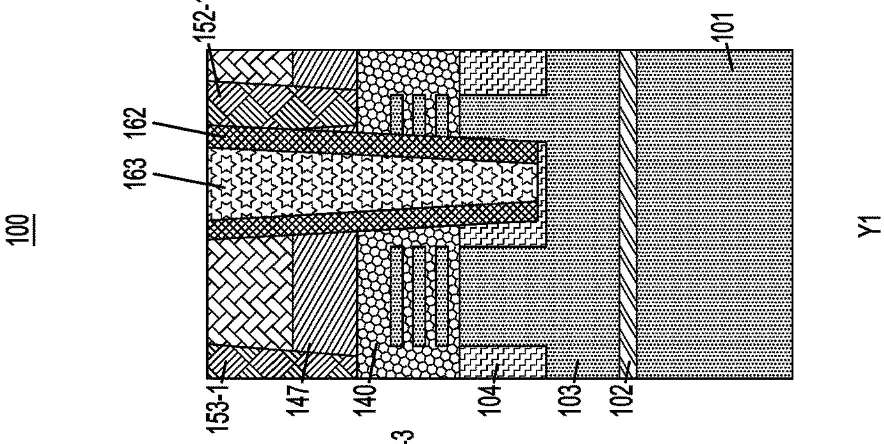
FIG. 8D depicts a third cross-sectional view corresponding to the line Y1 in FIG. 8A following OPL formation, according to an embodiment of the invention.
Figure 8C:
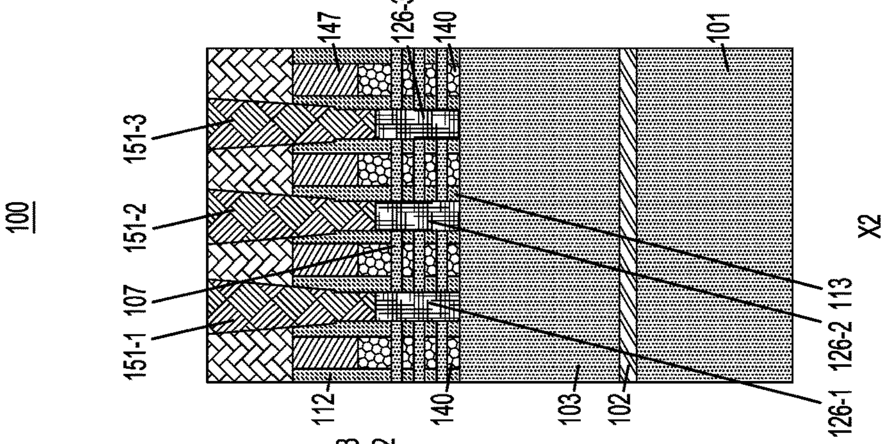
FIG. 8C depicts a second cross-sectional view corresponding to the line X2 in FIG. 8A following OPL formation, according to an embodiment of the invention.
Figure 8B:
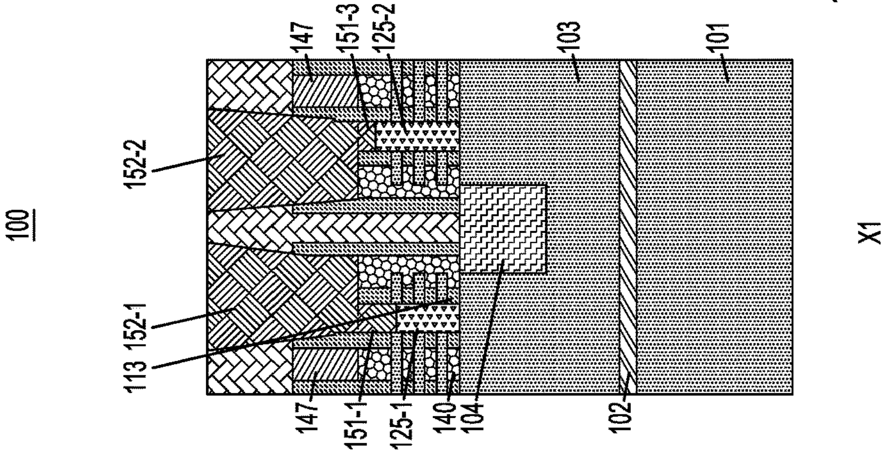
FIG. 8B depicts a first cross-sectional view corresponding to the line X1 in FIG. 8A following organic planarization layer (OPL) formation, according to an embodiment of the invention.

Referring to FIG. 8A and to the cross-sectional views in FIGS. 8B, 8C, 8D and 8E, which respectively correspond to the lines X1, X2, Y1 and Y2 in FIG. 8A, an organic planarization layer (OPL) 163 is formed on the dielectric liner layer 162 in a remaining portion of the opening 160. The OPL 163 comprises, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL-102, or other similar commercially available materials from such vendors as JSR, TOK, Sumitomo, Rohm & Haas, etc. The OPL 163 can be deposited, for example, by spin coating, followed by an etch back process.

Figure 9A:
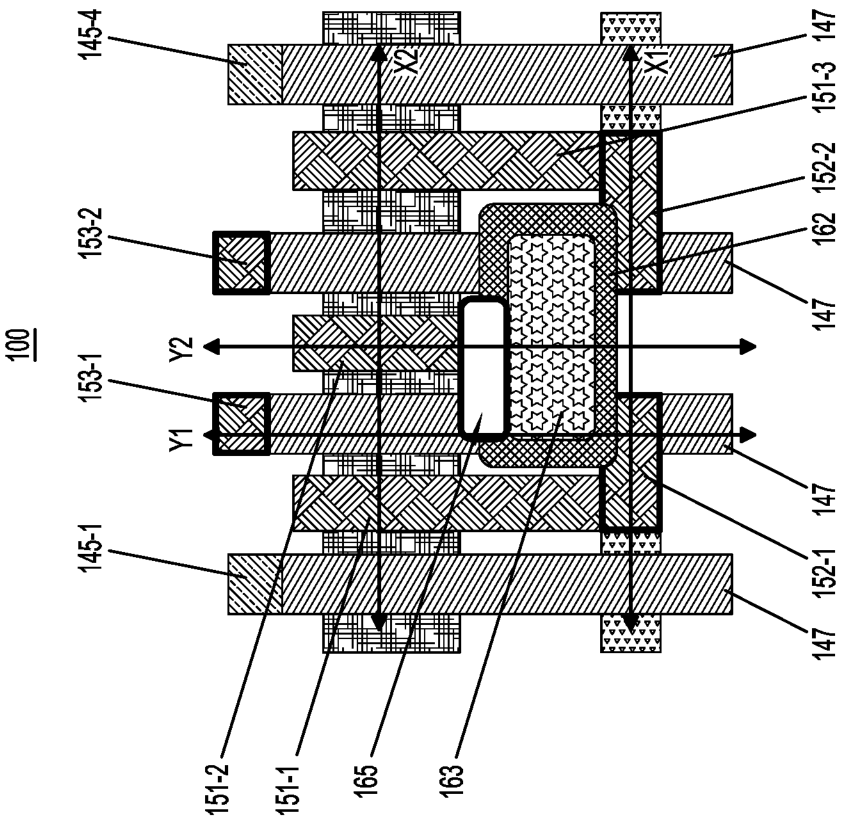
FIG. 9A depicts a top view of a semiconductor structure with lines X1, X2, Y1 and Y2 on which the cross-sectional views of FIGS. 9B-10D are based, according to an embodiment of the invention.
Figure 9E:
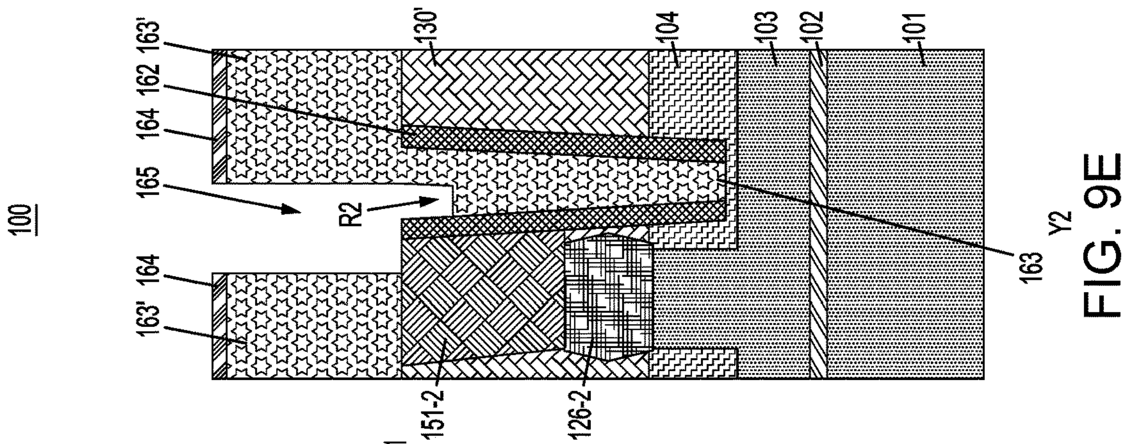
FIG. 9E depicts a fourth cross-sectional view corresponding to the line Y2 in FIG. 9A following OPL recessing, according to an embodiment of the invention.
Figure 9D:
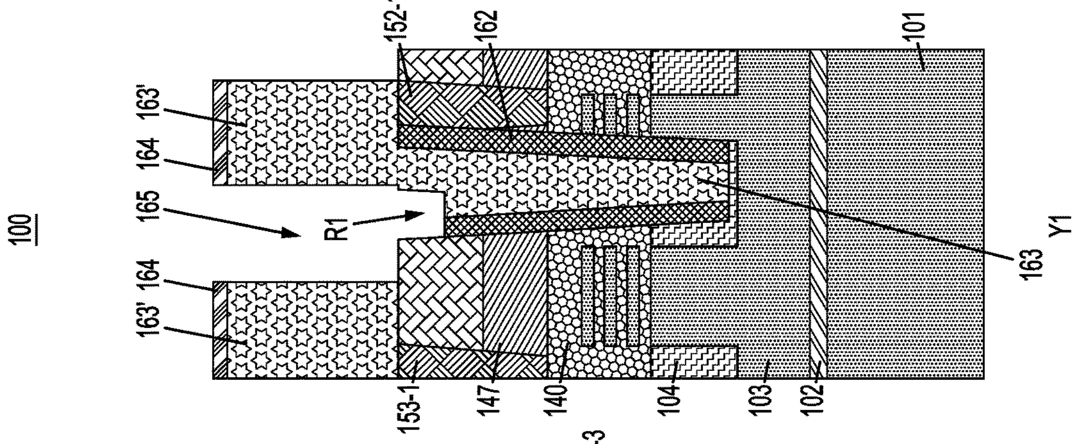
FIG. 9D depicts a third cross-sectional view corresponding to the line Y1 in FIG. 9A following OPL recessing, according to an embodiment of the invention.
Figure 9C:
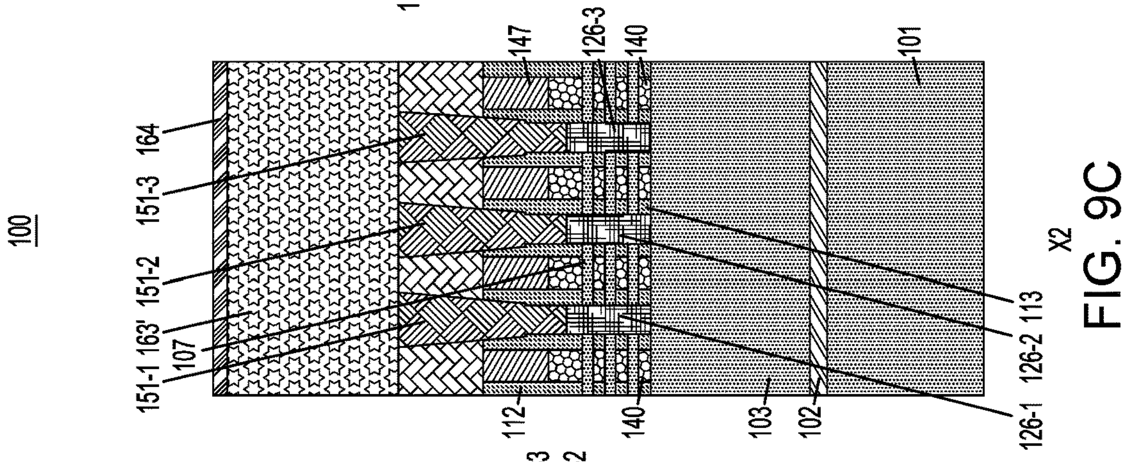
FIG. 9C depicts a second cross-sectional view corresponding to the line X2 in FIG. 9A following OPL recessing, according to an embodiment of the invention.
Figure 9B:
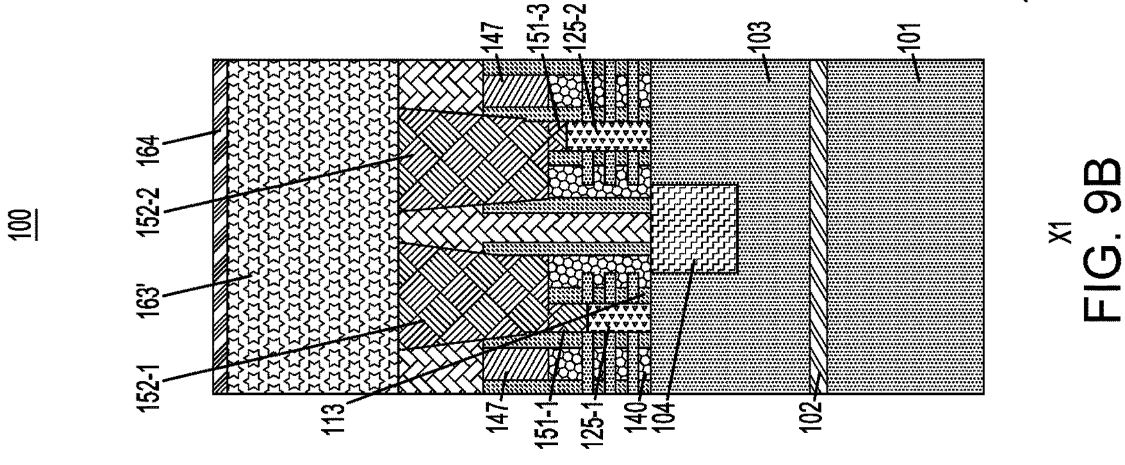
FIG. 9B depicts a first cross-sectional view corresponding to the line X1 in FIG. 9A following OPL recessing, according to an embodiment of the invention.

Referring to FIG. 9A, to the cross-sectional views in FIGS. 9B, 9C, 9D and 9E, and to the cross-sectional views in FIGS. 10A, 10B, 10C and 10D, parts of the OPL 163 are recessed to form recessed portions R1 and R2, and then a portion of the dielectric liner layer 162 is removed (e.g., pulled-down) to expose part of a side surface of the source/drain contact 151-2. In more detail, an additional OPL 163' is formed on the semiconductor structure 100 of FIGS. 8A-8E. An anti-reflective coating (ARC) layer 164 is formed on portions of the additional OPL 163'. The ARC layer 164 leaves exposed a portion of the additional OPL 163', which is removed to form opening 165 exposing parts of the underlying OPL 163. The parts of the underlying OPL 163 are removed to form recessed portions R1 and R2 of the OPL 163. Portions of the OPL 163 can be removed using, for example, oxygen plasma, nitrogen/hydrogen plasma or other carbon strip processes. OPL stripping causes minimal or no damage to exposed layers.

Figures 10A, 10B, 10C, 10D:
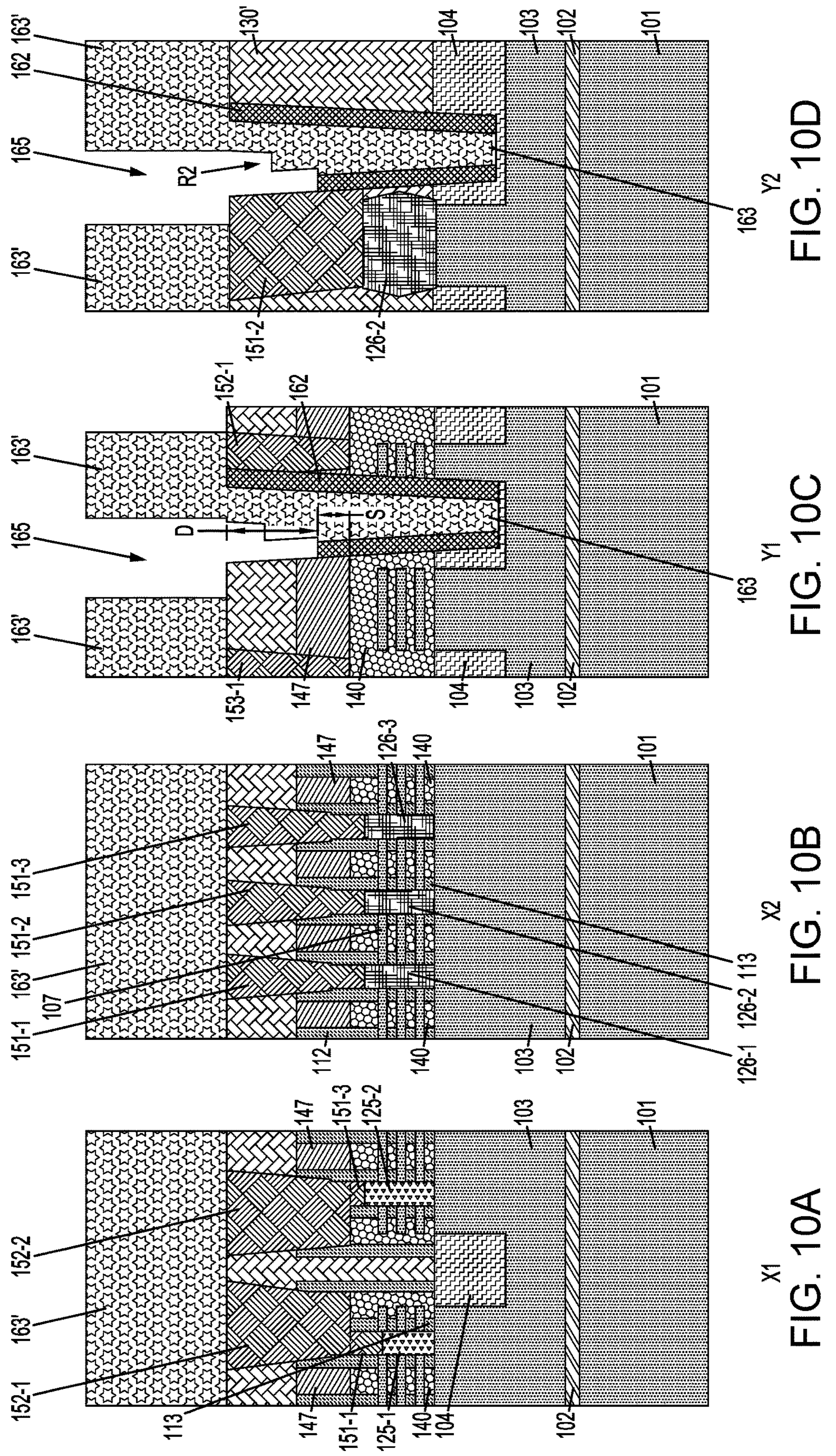
FIG. 10A depicts a first cross-sectional view corresponding to the line X1 in FIG. 9A following dielectric liner layer pull-down, according to an embodiment of the invention.
FIG. 10B depicts a second cross-sectional view corresponding to the line X2 in FIG. 9A following dielectric liner layer pull-down, according to an embodiment of the invention.
FIG. 10C depicts a third cross-sectional view corresponding to the line Y1 in FIG. 9A following dielectric liner layer pull-down, according to an embodiment of the invention.
FIG. 10D depicts a fourth cross-sectional view corresponding to the line Y2 in FIG. 9A following dielectric liner layer pull-down, according to an embodiment of the invention.

Then, referring to FIGS. 10A-10D, an exposed portion of the dielectric liner layer 162 is etched down to a depth D, which allows adequate space S away from the gate region 140. In illustrative embodiments, the space S is in the range of about 5 nm to about 15 nm. As can be seen in FIG. 10D, as a result of the etching down of the dielectric liner layer 162, in the area corresponding to the recessed portion R2, the removal of the dielectric liner layer 162 exposes a side portion of the source/drain contact 151-2. Etching of the dielectric liner layer 162 can be performed using, for example, a selective dry etch process. The overlay tolerance for the opening 165 is large and allows for misalignment errors.

Figure 11A:
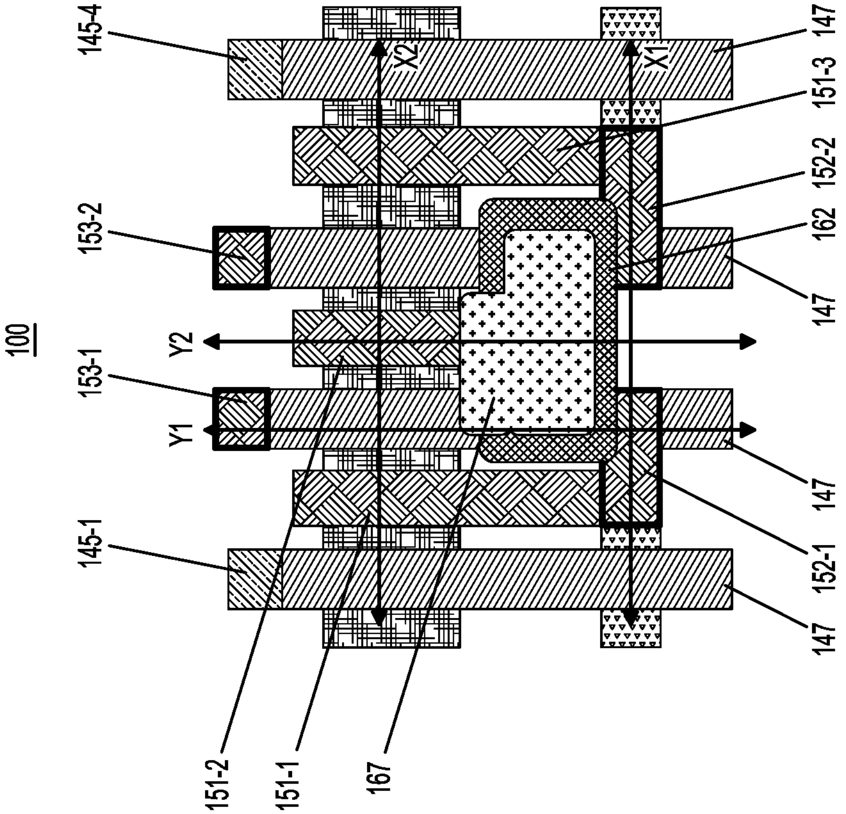
FIG. 11A depicts a top view of a semiconductor structure with lines X1, X2, Y1 and Y2 on which the cross-sectional views of FIGS. 11B-14D are based, according to an embodiment of the invention.
Figure 11B:
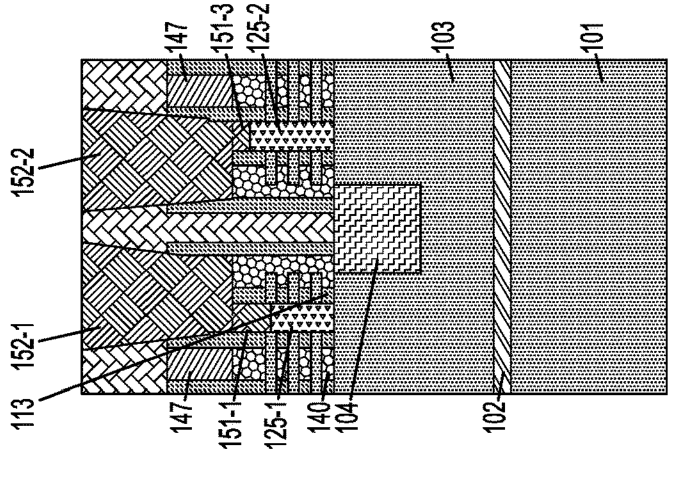
FIG. 11B depicts a first cross-sectional view corresponding to the line X1 in FIG. 11A following OPL removal and deep via metallization, according to an embodiment of the invention.
Figure 11C:
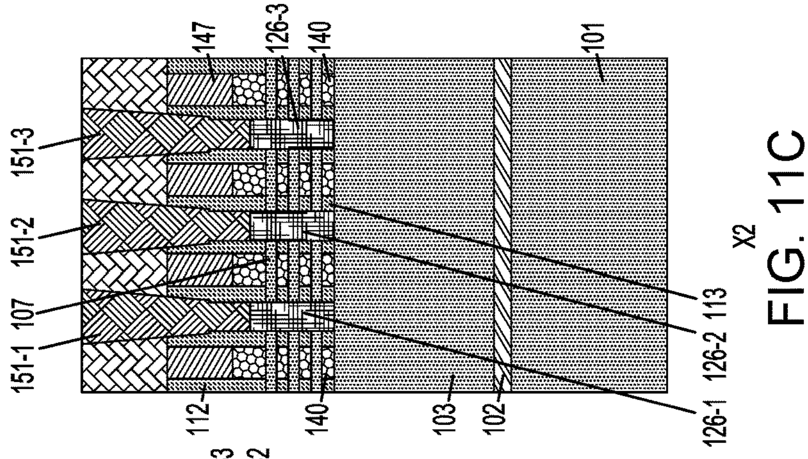
FIG. 11C depicts a second cross-sectional view corresponding to the line X2 in FIG. 11A following OPL removal and deep via metallization, according to an embodiment of the invention.

Referring to FIG. 11A and to the cross-sectional views in FIGS. 11B, 11C, 11D and 11E, which respectively correspond to the lines X1, X2, Y1 and Y2 in FIG. 11A, the remaining OPLs 163' and 163 are removed using, for example, oxygen plasma, nitrogen/hydrogen plasma or other carbon strip processes. Then the vacant area left by the removal of the OPL 163 and the portions of the dielectric liner layer 162 are filled with a conductive material to form the deep via 167. As can be seen, the deep via 167 is electrically and physically isolated from the cross-couple contacts 152-1 and 152-2 by the dielectric liner layer 162 formed between the deep via 167 and the cross-couple contacts 152-1 and 152-2. In addition, the deep via 167 contacts and is electrically connected to the source/drain contact 151-2, which as noted herein above and shown in FIGS. 11A, 11C and 11E, contacts the n-type source/drain region 126-2. The portion of the deep via 167 disposed on and contacting the side surface of the source/drain contact 151-2 is disposed over the recessed portion of the dielectric liner layer 162 (e.g., left portion of the dielectric liner layer 162 in the cross-sectional view of FIG. 11E), which has lower height with respect to the second semiconductor substrate 103 than the right portion of the dielectric liner layer 162 in the cross-sectional view of FIG. 11E. The deep via 167 is further electrically and physically isolated from the source/drain contacts 151-1 and 151-3.

Figure 11D:
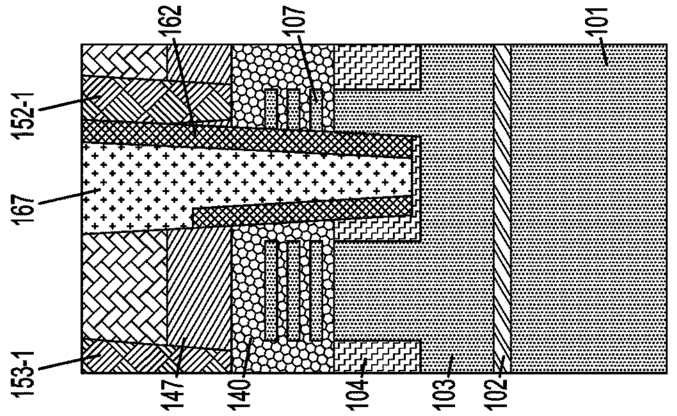
FIG. 11D depicts a third cross-sectional view corresponding to the line Y1 in FIG. 11A following OPL removal and deep via metallization, according to an embodiment of the invention.
Figure 11E:
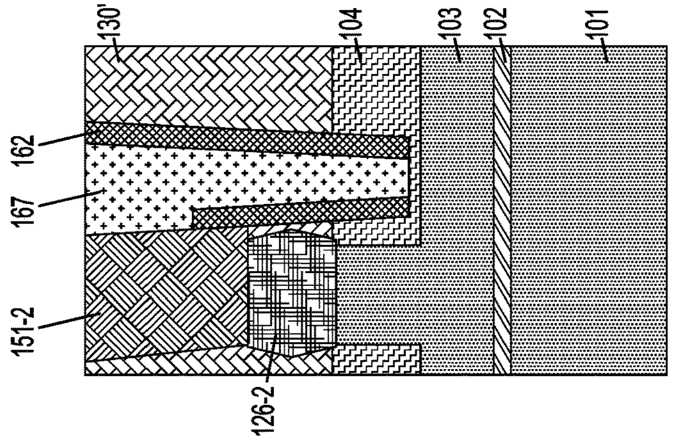
FIG. 11E depicts a fourth cross-sectional view corresponding to the line Y2 in FIG. 11A following OPL removal and deep via metallization, according to an embodiment of the invention.
Figure 12A:
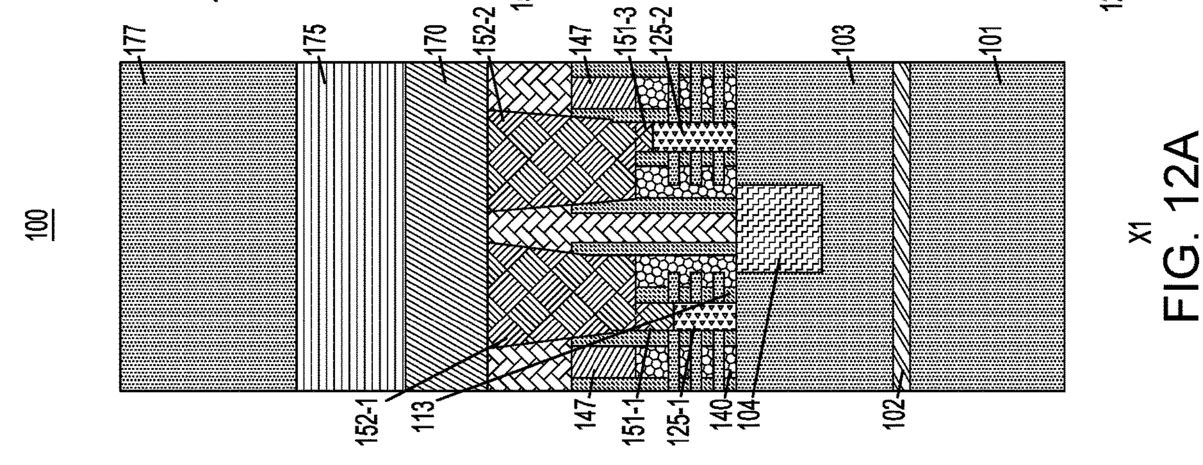
FIG. 12A depicts a first cross-sectional view corresponding to the line X1 in FIG. 11A following back-end-of-line (BEOL) interconnect formation and carrier wafer bonding, according to an embodiment of the invention.
Figure 12B:
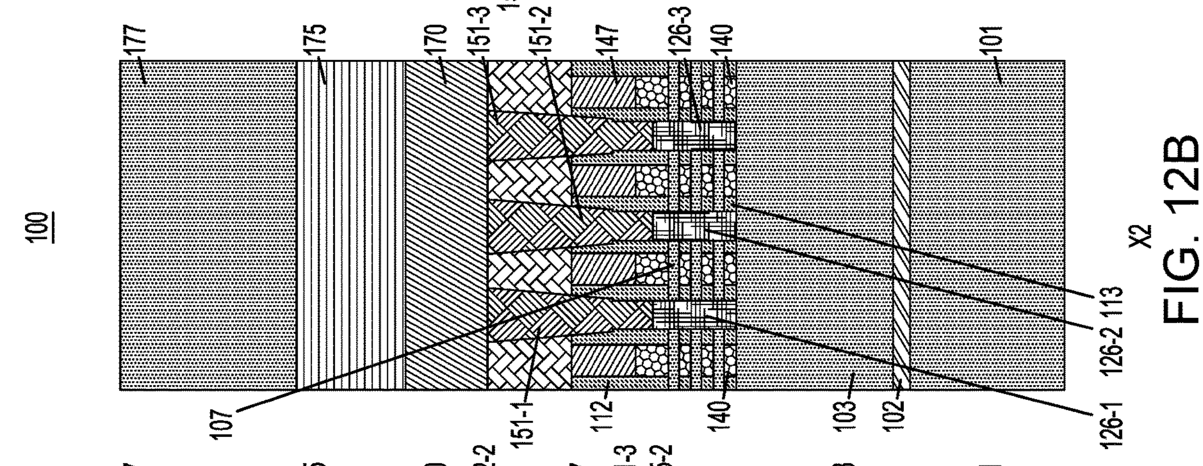
FIG. 12B depicts a second cross-sectional view corresponding to the line X2 in FIG. 11A following BEOL interconnect formation and carrier wafer bonding, according to an embodiment of the invention.
Figure 12C:
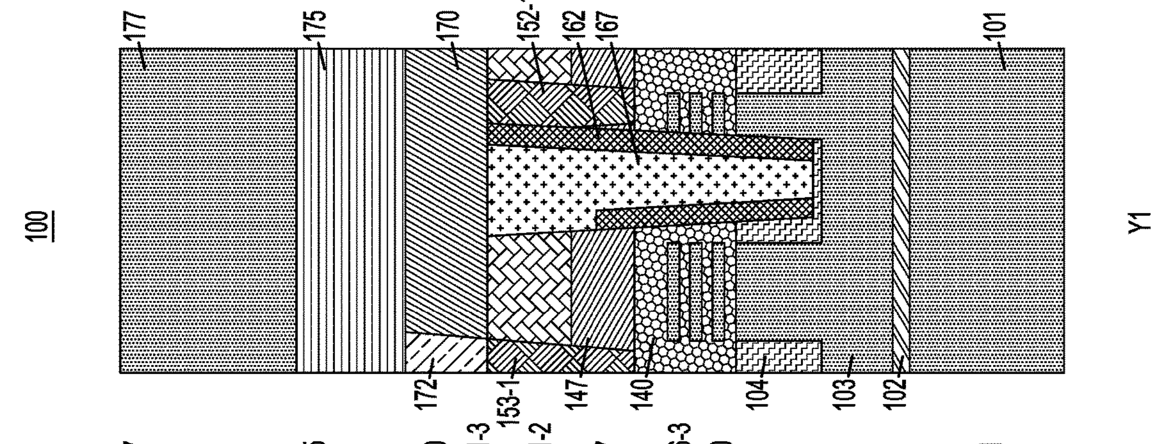
FIG. 12C depicts a third cross-sectional view corresponding to the line Y1 in FIG. 11A following BEOL interconnect formation and carrier wafer bonding, according to an embodiment of the invention.
Figure 12D:
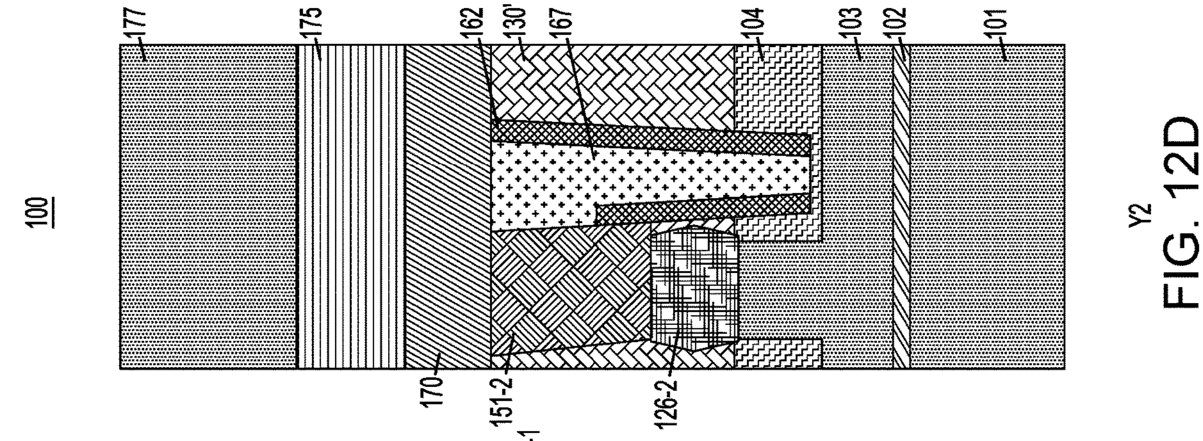
FIG. 12D depicts a fourth cross-sectional view corresponding to the line Y2 in FIG. 11A following BEOL interconnect formation and carrier wafer bonding, according to an embodiment of the invention.
Figures 13A, 13B, 13C, 13D:
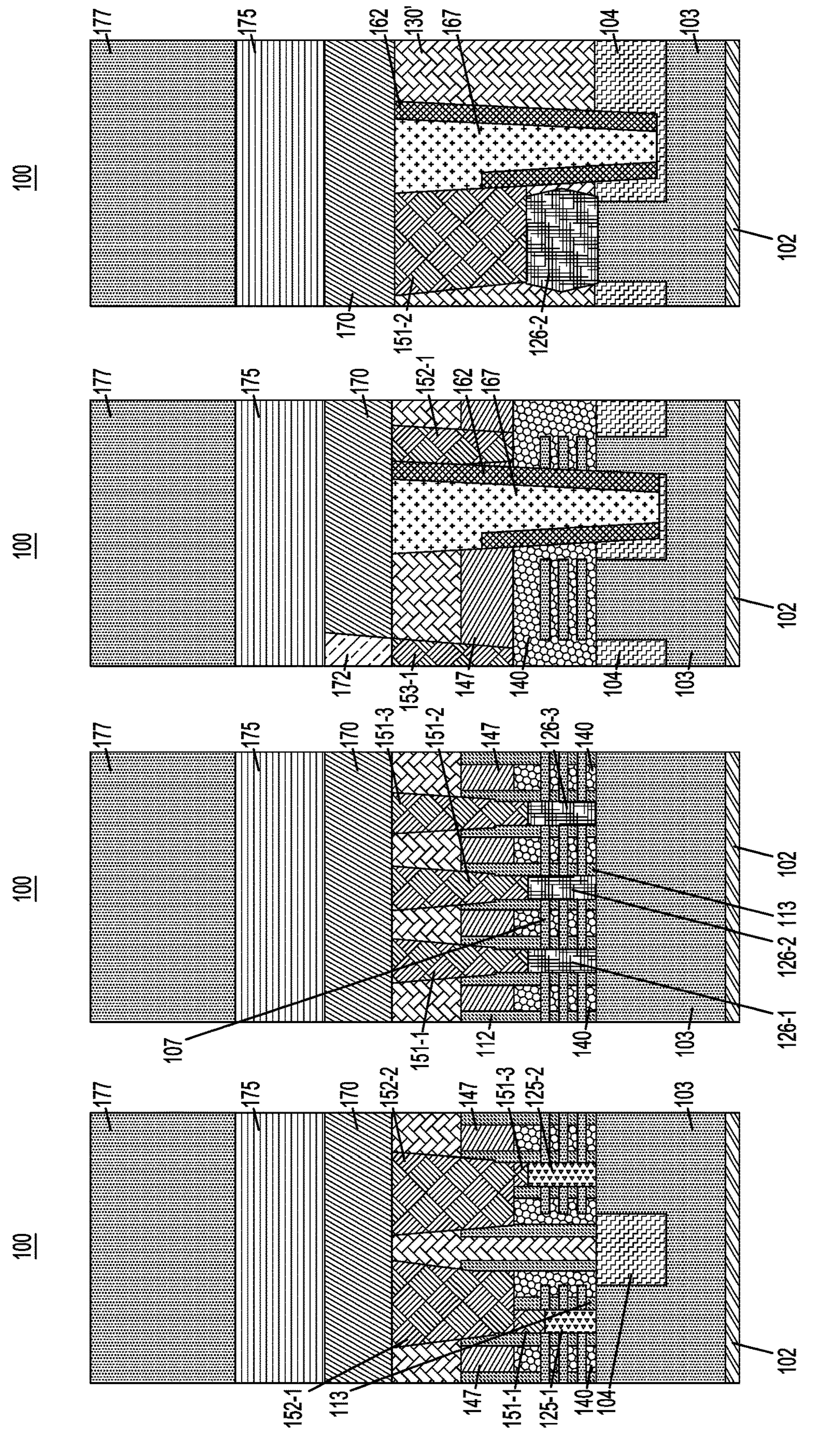
FIG. 13A depicts a first cross-sectional view corresponding to the line X1 in FIG. 11A following wafer flipping and semiconductor substrate removal, according to an embodiment of the invention.
FIG. 13B depicts a second cross-sectional view corresponding to the line X2 in FIG. 11A following wafer flipping and semiconductor substrate removal, according to an embodiment of the invention.
FIG. 13C depicts a third cross-sectional view corresponding to the line Y1 in FIG. 11A following wafer flipping and semiconductor substrate removal, according to an embodiment of the invention.
FIG. 13D depicts a fourth cross-sectional view corresponding to the line Y2 in FIG. 11A following wafer flipping and semiconductor substrate removal, according to an embodiment of the invention.
Figure 14A:
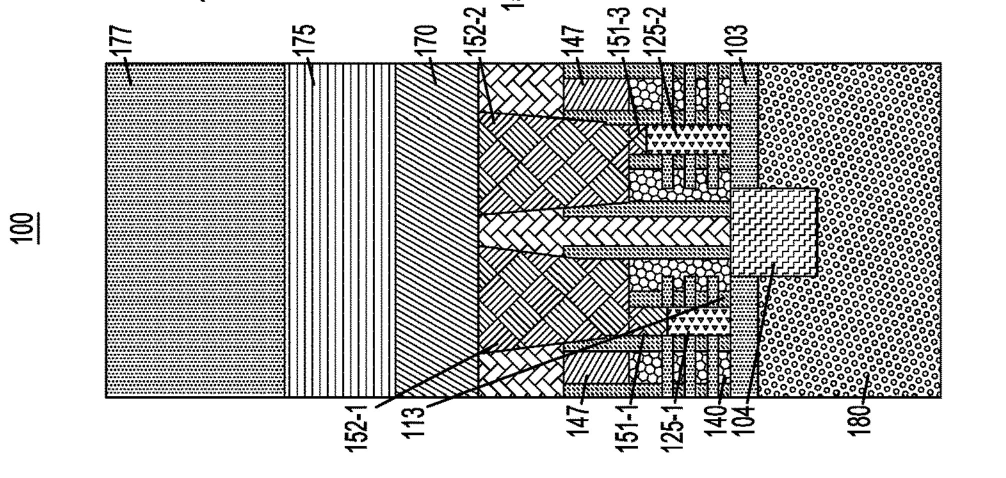
FIG. 14A depicts a first cross-sectional view corresponding to the line X1 in FIG. 11A following etch stop layer removal, semiconductor substrate recessing, backside ILD layer formation and planarization, according to an embodiment of the invention.
Figure 14B:
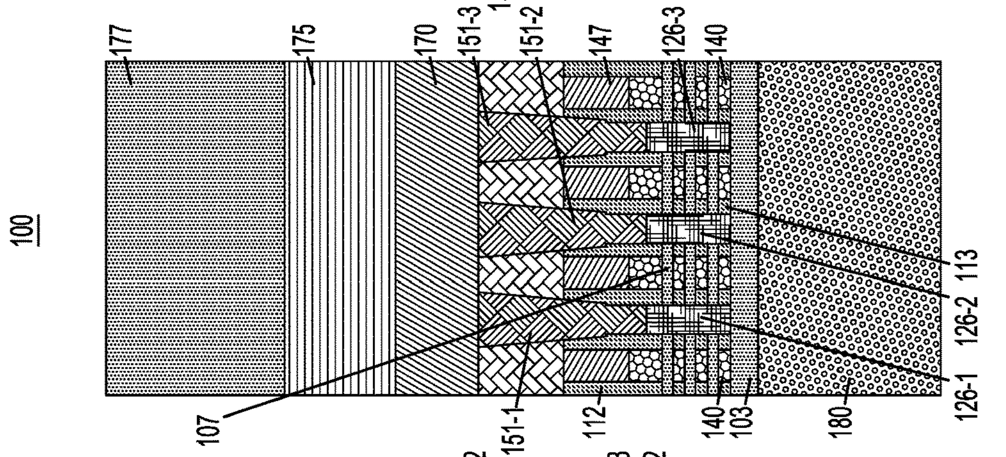
FIG. 14B depicts a second cross-sectional view corresponding to the line X2 in FIG. 11A following etch stop layer removal, semiconductor substrate recessing, backside ILD layer formation and planarization, according to an embodiment of the invention.
Figure 14C:
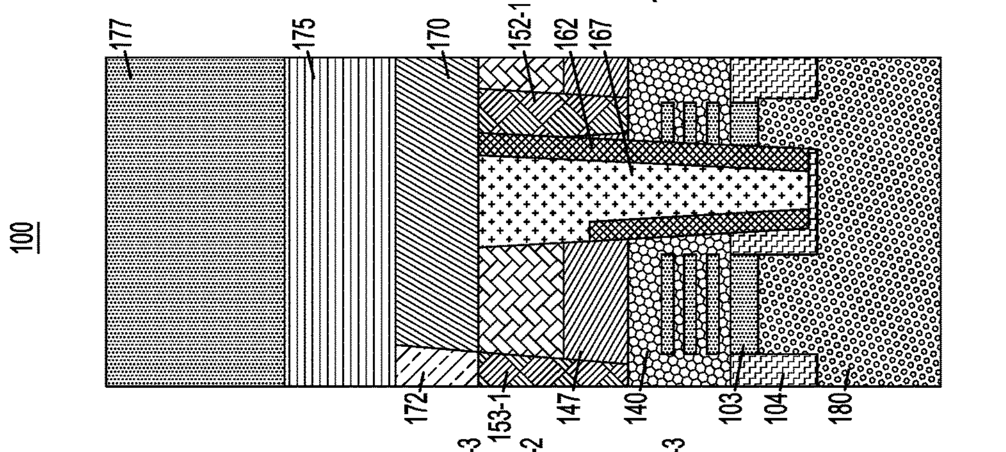
FIG. 14C depicts a third cross-sectional view corresponding to the line Y1 in FIG. 11A following etch stop layer removal, semiconductor substrate recessing, backside ILD layer formation and planarization, according to an embodiment of the invention.
Figure 14D:
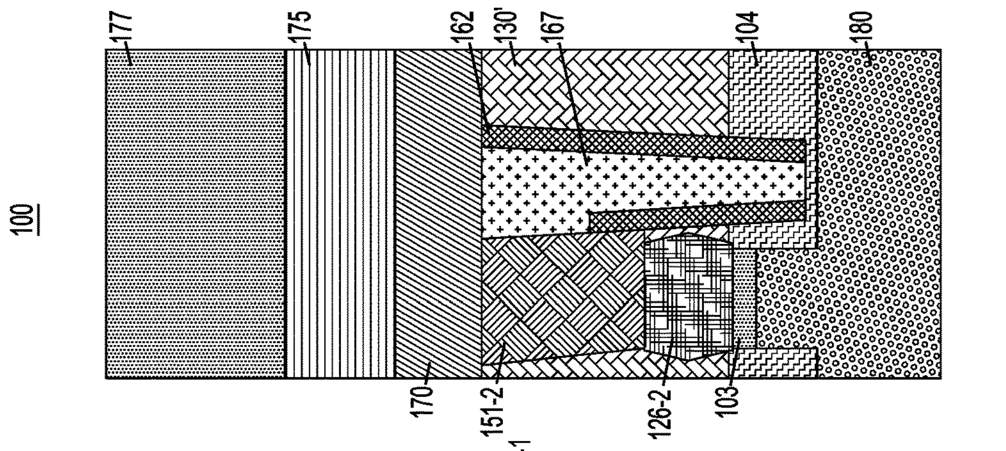
FIG. 14D depicts a fourth cross-sectional view corresponding to the line Y2 in FIG. 11A following etch stop layer removal, semiconductor substrate recessing, backside ILD layer formation and planarization, according to an embodiment of the invention.

The conductive material deposited in the vacant area left by the removal of the OPL 163 and the portions of the dielectric liner layer 162 to form the deep via 167 comprises, for example, a silicide layer, such as Ni, Ti, NiPt, etc., a metal adhesion layer, such as TiN, and a conductive metal fill layer, such as W, Al, Co, Ru, etc., and can be deposited using, for example, a deposition technique such as CVD, PECVD, RFCVD, PVD, ALD, MBD, PLD, LSMCD, sputtering and/or plating, followed by a planarization process such as, CMP to remove excess portions of the metal layers from on top of the additional ILD layer 130'. As can be seen, part of the deep via 167 is surrounded by the dielectric liner layer 162. In other words, the dielectric liner layer 162 is formed around parts of the deep via 167. Referring to FIG. 11D, the dielectric liner layer 162 is formed on and contacts side surfaces of a gate region 140 and channel layers 107 to isolate the deep via 167 from the gate region 140 and channel layers 107. Portions of the gate region 140 are alternately stacked with the channel layers 107. Referring to FIG. 11E, a remaining portion of the deep via 167 around which the dielectric liner layer 162 is not formed contacts and is disposed on a surface of the source/drain contact 151-2.

Referring to FIGS. 12A-12D, additional ILD material is deposited to form an upper ILD layer 170 on top of the additional ILD layer 130'. In more detail, the additional ILD material is deposited on exposed top surfaces of the additional ILD layer 130', source/drain contacts 151, cross-couple contacts 152, gate contacts 153, and deep via 167. In illustrative embodiments, the additional ILD material includes the same material as or a similar material to the additional ILD layer 130' and ILD layer 130 and is deposited using deposition techniques such as, for example, CVD, PECVD, RFCVD, PVD, ALD, MBD, PLD, and/or LSMCD, which may be followed by a planarization process, such as, CMP.

Frontside BEOL interconnects 175 are formed on the upper ILD layer 170. A carrier wafer 177 is bonded to the frontside BEOL interconnects 175. The frontside BEOL interconnects 175 include various BEOL interconnect structures. In an illustrative embodiment, the BEOL interconnect structures electrically connect to the gate contact 153-1 through a frontside via 172, which delivers a gate voltage to the gate contact 153-1. The BEOL interconnect structures of the frontside BEOL interconnects 175 may form other connections (not shown) to frontside contacts. For example, some S/D contacts (not shown) may be connected to the BEOL interconnect structures. The carrier wafer 177 may be formed of materials similar to that of the first semiconductor substrate 101, and may be formed over the frontside BEOL interconnects 175 using a wafer bonding process, such as dielectric-to-dielectric bonding.

Referring to FIGS. 13A-13D, using the carrier wafer 177, the semiconductor structure 100 may be "flipped" (e.g., rotated 180 degrees) so that the structure is inverted. In addition, the first semiconductor substrate 101 is removed from the backside of the semiconductor structure 100. The removal process, which comprises etching of the first semiconductor substrate 101, stops at the etch stop layer 102. For example, the first semiconductor substrate 101 is selectively etched with an etchant that selectively etches silicon with respect to a material of the etch stop layer 102 (e.g., SiGe).

Referring to FIGS. 14A-14D, the etch stop layer 102 and a portion of the second semiconductor substrate 103 (e.g., silicon layer) are selectively removed from the semiconductor structure 100 with respect to the dielectric liner layer 162 and the isolation regions 104. As shown in FIGS. 14A-14D, the etch stop layer 102 is removed, followed by removal of a majority of the second semiconductor substrate 103, wherein remaining portions of second semiconductor substrate 103, and portions of the isolation regions 104 and dielectric liner layer 162 are exposed. Etching processes for removal of the etch stop layer 102 include, for example, IBE by Ar/CHF3 based chemistry.

A backside ILD layer 180 is deposited to fill in areas formerly occupied by the removed portions of the second semiconductor substrate 103. The backside ILD layer 180 is deposited using deposition techniques such as, for example, CVD, PECVD, RFCVD, PVD, ALD, MBD, PLD, and/or LSMCD, followed by a planarization process, such as, CMP. The backside ILD layer 180 may comprise, for example, SiOx, SiOC, SiOCN or some other dielectric.

Figure 15A:
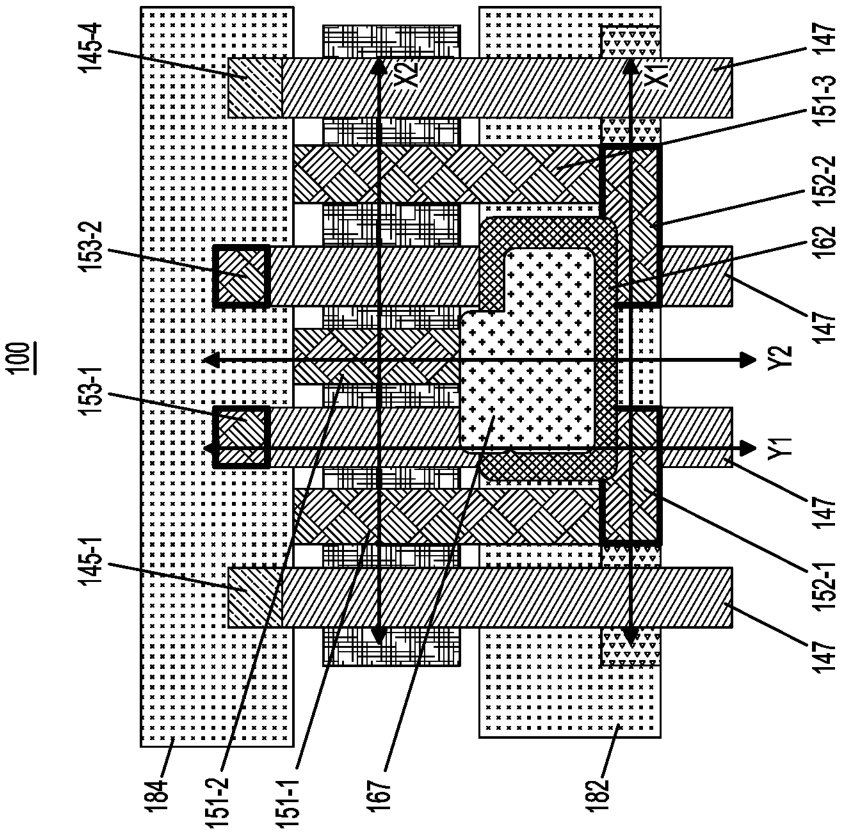
FIG. 15A depicts a top view of a semiconductor structure with lines X1, X2, Y1 and Y2 on which the cross-sectional views of FIGS. 15B-16D are based, according to an embodiment of the invention.
Figure 15E:
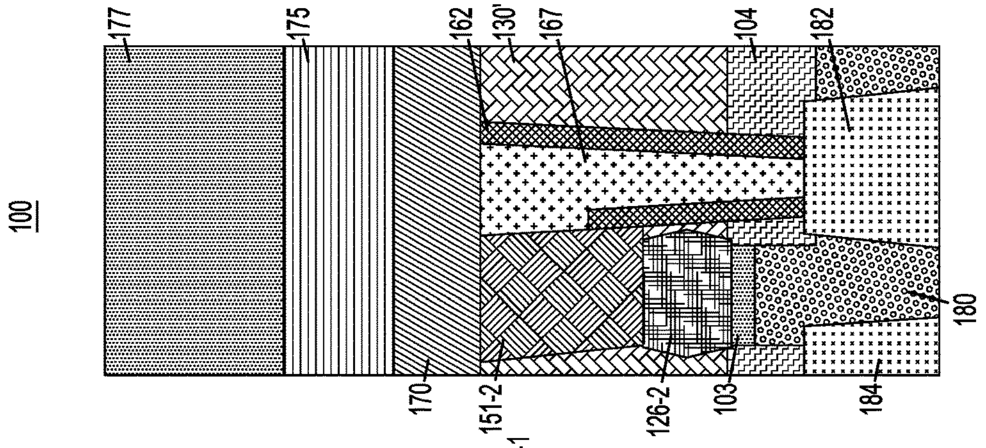
FIG. 15E depicts a fourth cross-sectional view corresponding to the line Y2 in FIG. 15A following backside bit-line and VSS line formation, according to an embodiment of the invention.
Figure 15D:
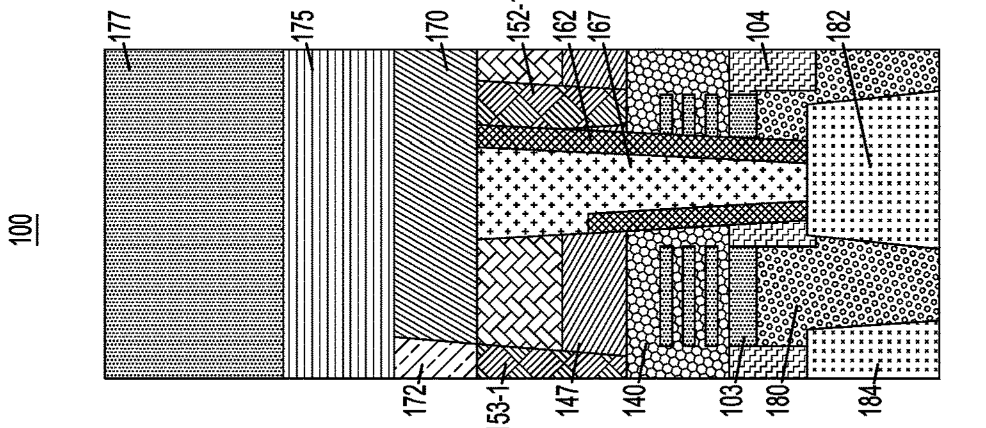
FIG. 15D depicts a third cross-sectional view corresponding to the line Y1 in FIG. 15A following backside bit-line and VSS line formation, according to an embodiment of the invention.
Figure 15C:
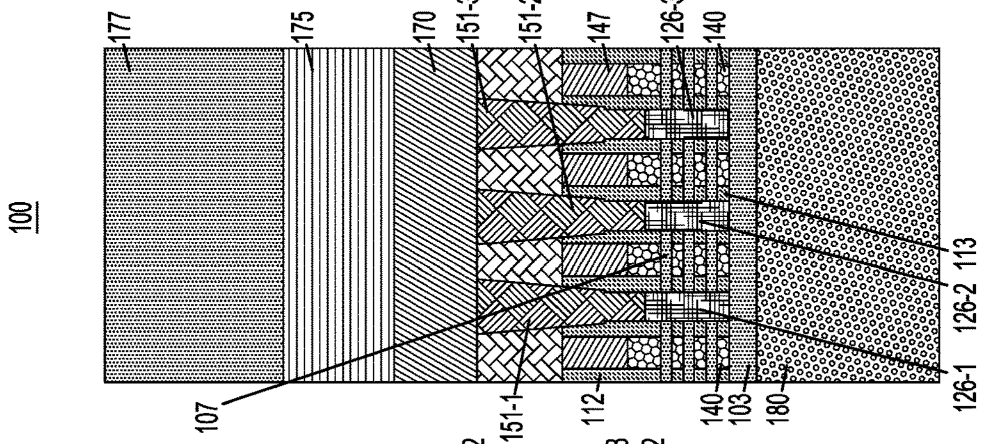
FIG. 15C depicts a second cross-sectional view corresponding to the line X2 in FIG. 15A following backside bit-line and VSS line formation, according to an embodiment of the invention.
Figure 15B:
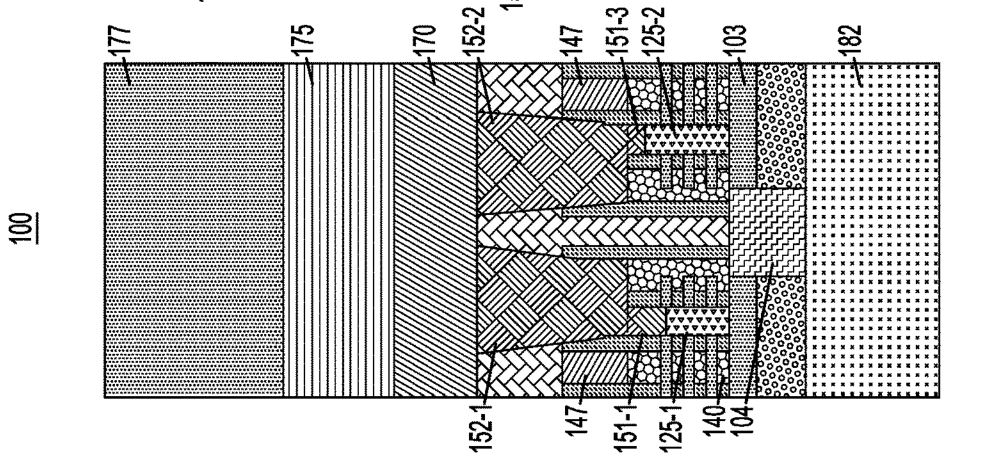
FIG. 15B depicts a first cross-sectional view corresponding to the line X1 in FIG. 15A following backside bit-line and ground or source voltage (VSS) line formation, according to an embodiment of the invention.
Figures 16A, 16B, 16C, 16D:
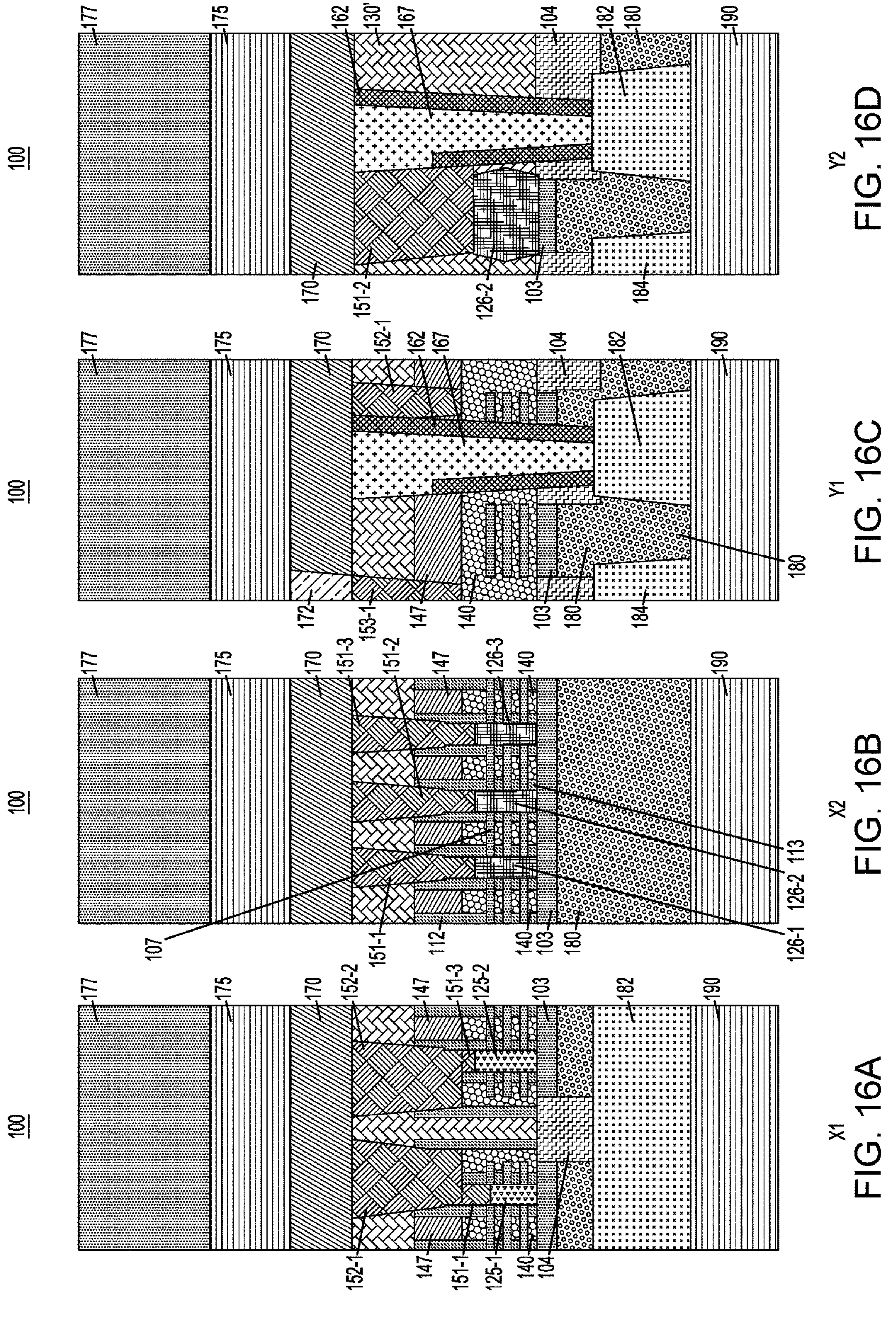
FIG. 16A depicts a first cross-sectional view corresponding to the line X1 in FIG. 15A following backside power delivery network (BSPDN) formation, according to an embodiment of the invention.
FIG. 16B depicts a second cross-sectional view corresponding to the line X2 in FIG. 15A following BSPDN formation, according to an embodiment of the invention.
FIG. 16C depicts a third cross-sectional view corresponding to the line Y1 in FIG. 15A following BSPDN formation, according to an embodiment of the invention.
FIG. 16D depicts a fourth cross-sectional view corresponding to the line Y2 in FIG. 15A following BSPDN formation, according to an embodiment of the invention.

Referring to FIG. 15A and to the cross-sectional views in FIGS. 15B, 15C, 15D and 15E, which respectively correspond to the lines X1, X2, Y1 and Y2 in FIG. 15A, a backside bit-line 182 and a backside ground or source voltage line 184 ("backside VSS line 184") are formed in the backside ILD layer 180 and in portions of the isolation regions 104. In forming the backside bit-line 182 and the backside VSS line 184, openings are formed through portions of the backside ILD layer 180 and in portions of the isolation regions 104. Some of the openings (e.g., openings corresponding to the backside bit-line 182 expose portions of the deep via 167 on which the backside bit-line 182 is to be formed. As can be seen, the deep via 167 contacts and is electrically connected to the backside bit-line 182. As a result, the source/drain contact 151-2 and n-type source/drain region 126-2 are electrically connected to the backside bit-line 182 through the deep via 167. The backside VSS line 184 is connected to, for example, one or more nFET source/drain regions (not shown).

The backside bit-line 182 and the backside VSS line 184 are formed in portions of the backside ILD layer 180 and of the isolation regions 104 by forming trenches in the backside ILD layer 180 and the isolation regions 104 and filling the trenches with conductive material. Trenches are opened in the in the backside ILD layer 180 and the isolation regions 104 using, for example, lithography followed by RIE. The backside bit-line 182 and the backside VSS line 184 are formed in the trenches by filling the trenches with conductive material, such as, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed on side and bottom surfaces of the trenches before filling the trenches with the conductive material. Deposition of the conductive material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Referring to FIGS. 16A-16D, a backside power delivery network (BSPDN) 190 (also referred to herein as backside interconnects) is formed on the backside ILD layer 180 and on the backside bit-line 182 and the backside VSS line 184. The BSPDN 190 connects to the backside bit-line 182 and the backside VSS line 184 and includes various BSPDN structures such as, but not necessarily limited to, interconnects in a power supply path from voltage regulator modules (VRMs) to circuits. The interconnects can comprise, for example, power and ground planes in circuit boards, cables, connectors and capacitors associated with a power supply. Backside power delivery prevents BEOL routing congestion, resulting in power performance benefits.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

As noted above, the embodiments provide techniques and structures for forming a via (e.g., deep via 167) adjacent an MOL contact (e.g., cross-couple contact 152-1 or 152-2) and an isolation structure (e.g., dielectric liner layer 162) around the via. A cross-couple contact (e.g., cross-couple contact 152-1 or 152-2) is electrically connected to a source/drain region of a transistor (e.g., one of the p-type source/drain regions 125) and to a gate region of the transistor. The deep via 167 is disposed along a side of the cross-couple contact, wherein the deep via 167 comprises a conductive material. The dielectric liner layer 162 is disposed around at least a portion of the conductive material, and electrically isolates the cross-couple contact from the conductive material. The deep via 167 contacts the backside bit-line 182. The cross-couple contact is disposed on a first side (e.g., frontside) of a semiconductor device, and the backside bit-line 182 is disposed on a second side (e.g., backside) of the semiconductor device. A first portion of the deep via 167 is on the frontside of the semiconductor device and a second portion of the deep via 167 is on the backside of the semiconductor device. In illustrative embodiments, the semiconductor device is a static random-access memory (SRAM) device, and the transistor is part of the SRAM device.

A source/drain contact (e.g., source/drain contact 151-2) is disposed on another source/drain region (e.g., n-type source/drain region 126-2). A portion of the conductive material of the deep via 167 is disposed on a side portion of the source/drain contact over a recessed portion of the dielectric liner layer 162 (see FIG. 11E).

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:

a cross-couple contact electrically connected to a source/drain region of a transistor and to a gate region of the transistor;

a via disposed along a side of the cross-couple contact, wherein the via comprises a conductive material; and a dielectric liner layer disposed around at least a portion of the conductive material;

wherein the dielectric liner layer electrically isolates the cross-couple contact from the conductive material; and wherein the via contacts a bit-line.

2. The semiconductor device of claim 1, wherein the cross-couple contact is disposed on a first side of the semiconductor device, and the bit-line is disposed on a second side of the semiconductor device opposite the first side.

3. The semiconductor device of claim 2, wherein the first side comprises a frontside of the semiconductor device and the second side comprises a backside of the semiconductor device.

4. The semiconductor device of claim 3, wherein the bit-line is connected to a backside power delivery network, and the bit-line is for a static random-access memory device.

5. The semiconductor device of claim 2, wherein a first portion of the via is on the first side and a second portion of the via is on the second side.

6. The semiconductor device of claim 1, wherein the transistor is part of a static random-access memory device.

7. The semiconductor device of claim 1, further comprising a source/drain contact disposed on another source/drain region, wherein a portion of the conductive material of the via is disposed on a side portion of the source/drain contact.

8. The semiconductor device of claim 7, wherein the portion of the conductive material of the via is disposed over a recessed portion of the dielectric liner layer.

9. The semiconductor device of claim 7, wherein the portion of the conductive material of the via contacts the side portion of the source/drain contact.

10. The semiconductor device of claim 1, wherein the transistor comprises a plurality of nanosheet channel layers and the dielectric liner layer contacts side portions of the plurality of nanosheet channel layers.

11. The semiconductor device of claim 10, wherein the plurality of nanosheet channel layers are alternately stacked with respective portions of the gate region.

12. The semiconductor device of claim 11, wherein the dielectric liner layer contacts the respective portions of the gate region.

13. A semiconductor device comprising:

a cross-couple contact electrically connecting a source/drain region of a transistor with a gate region of the transistor;

a conductive via disposed along a side of the cross-couple contact; and a dielectric liner layer disposed between the conductive via and the cross-couple contact;

wherein the dielectric liner layer electrically isolates the cross-couple contact from the conductive via; and wherein the conductive via is disposed on a bit-line.

14. The semiconductor device of claim 13, wherein the cross-couple contact is disposed on a first side of the semiconductor device, and the bit-line is disposed on a second side of the semiconductor device opposite the first side.

15. The semiconductor device of claim 13, further comprising a source/drain contact disposed on another source/drain region, wherein a portion of the conductive via is disposed on a side portion of the source/drain contact.

16. The semiconductor device of claim 15, wherein the portion of the conductive via is disposed over a recessed portion of the dielectric liner layer.

17. The semiconductor device of claim 16, wherein the conductive via contacts the side portion of the source/drain contact.

18. A semiconductor device comprising:

a nanosheet structure comprising a plurality of channel layers and a gate region;

an epitaxial source/drain region disposed on a side of the nanosheet structure;

a cross-couple contact disposed on the gate region and the epitaxial source/drain region, wherein the cross-couple contact electrically connects the epitaxial source/drain region with the gate region;

a conductive via disposed along a side of the cross-couple contact; and a dielectric liner layer disposed around at least a portion of the conductive via;

wherein the dielectric liner layer electrically isolates the cross-couple contact from the conductive via; and wherein the conductive via is disposed on and contacts a bit-line.

19. The semiconductor device of claim 18, wherein the cross-couple contact is disposed on a frontside of the semiconductor device, and the bit-line is disposed on a backside of the semiconductor device.

20. The semiconductor device of claim 18, further comprising a source/drain contact disposed on another epitaxial source/drain region, wherein a portion of the conductive via is disposed on a side portion of and contacts the source/drain contact.

* * * * *